United States Patent
Yamashita et al.

(10) Patent No.: US 9,148,104 B2
(45) Date of Patent: Sep. 29, 2015

(54) REPRODUCTION APPARATUS, REPRODUCTION METHOD, PROVISION APPARATUS, AND REPRODUCTION SYSTEM

(75) Inventors: Kosei Yamashita, Kanagawa (JP); Tetsunori Itabashi, Kanagawa (JP)

(73) Assignee: Sony Corporation, Tokyo (JP)

(*) Notice: Subject to any disclaimer, the term of this patent is extended or adjusted under 35 U.S.C. 154(b) by 1002 days.

(21) Appl. No.: 13/287,000

(22) Filed: Nov. 1, 2011

(65) Prior Publication Data
US 2012/0114127 A1    May 10, 2012

(30) Foreign Application Priority Data
Nov. 9, 2010    (JP) .............................. P2010-250714

(51) Int. Cl.
  *H03G 3/00*    (2006.01)
  *H03G 7/00*    (2006.01)
  *H04R 29/00*   (2006.01)
  *G06F 17/00*   (2006.01)
  *H03G 3/30*    (2006.01)

(52) U.S. Cl.
  CPC .......... *H03G 3/3089* (2013.01); *H03G 3/3005* (2013.01); *H03G 7/002* (2013.01); *H03G 7/007* (2013.01)

(58) Field of Classification Search
  CPC ........... H03G 3/001; H03G 3/20; H03G 3/02; H03G 3/32; H03G 3/3005; H03G 3/3089; H03G 3/005; H03G 7/002; H03G 7/007
  USPC ................ 381/107, 106, 104, 58, 56; 700/94
  See application file for complete search history.

(56) References Cited

U.S. PATENT DOCUMENTS

2005/0049735 A1 *    3/2005    Kim et al. ...................... 700/94

* cited by examiner

*Primary Examiner* — Vivian Chin
*Assistant Examiner* — Douglas Suthers
(74) *Attorney, Agent, or Firm* — Paratus Law Group, PLLC

(57) ABSTRACT

A reproduction apparatus includes: a reproduction unit which reproduces sound data; and a volume correction unit which correct a volume of the sound data reproduced by the reproduction unit on the basis of a relationship between a volume characteristic value of each of a plurality of pieces of sound data and a volume characteristic value of the sound data.

9 Claims, 25 Drawing Sheets

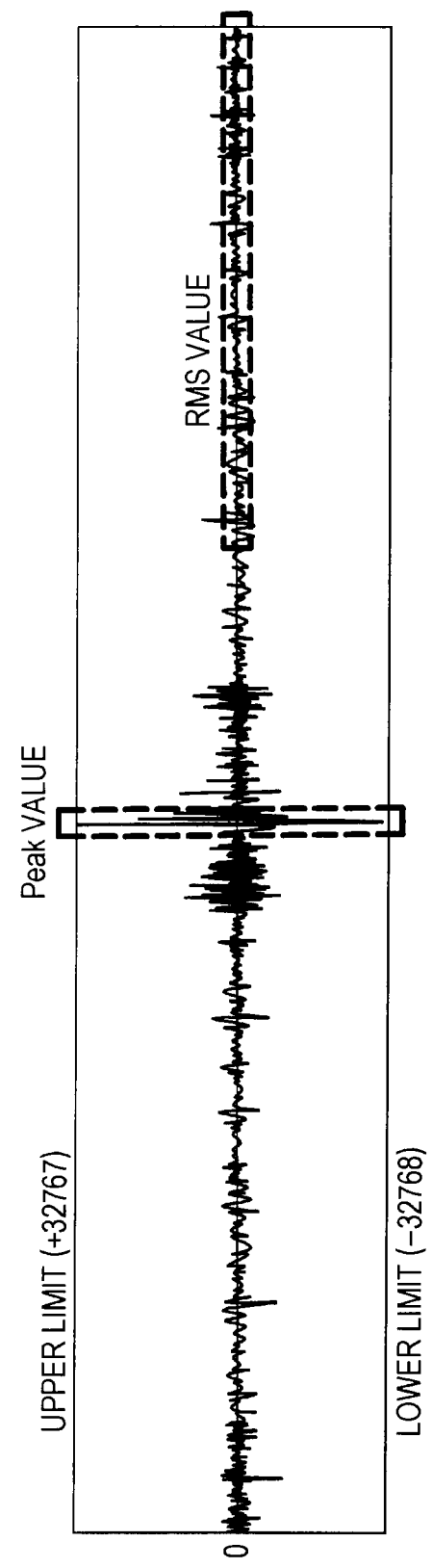

FIG. 5

Peak VALUE CALCULATION EXPRESSION

■ IN CASE OF MONAURAL SOUND

EACH SAMPLE VALUE OF MONAURAL PCM IS REPRESENTED BY Xi, AND TOTAL NUMBER OF SAMPLES OF SINGLE MUSIC TRACK IS REPRESENTED BY n.

max(a,b) IS FUNCTION THAT RETURNS GREATER VALUE.
abs(a) IS FUNCTION THAT RETURNS ABSOLUTE VALUE.

EXPRESSION 1)
```
for(from i = 1 to i = n)
{
    Peak = max(Peak, abs(Xi))
}
```

■ IN CASE OF STEREO SOUND

IN CASE OF STEREO PCM, WHEN SAMPLE VALUE OF L CHANNEL IS REPRESENTED BY Xi_L, AND SAMPLE VALUE OF R CHANNEL IS REPRESENTED BY Xi_R, THE FOLLOWING CALCULATION EXPRESSION IS OBTAINED.

EXPRESSION 2)
```
for(from i = 1 to i = n)
{
    Peak = max(Peak, abs(Xi_L))
    Peak = max(Peak, abs(Xi_R))
}
```

FIG. 6

CALCULATION EXPRESSION OF RMS VALUE

■ IN CASE OF MONAURAL SOUND

EACH SAMPLE VALUE OF MONAURAL PCM IS REPRESENTED BY Xi, AND TOTAL NUMBER OF SAMPLES OF SINGLE MUSIC TRACK IS REPRESENTED BY n.
sqrt() IS FUNCTION THAT RETURNS SQUARE ROOT.

EXPRESSION 3)

$$rms = sqrt((\sum_{i=1}^{n}(Xi*Xi))/n)$$

■ IN CASE OF STEREO SOUND

IN CASE OF STEREO PCM, WHEN SAMPLE VALUE OF L CHANNEL IS REPRESENTED BY Xi_L, AND SAMPLE VALUE OF R CHANNEL IS REPRESENTED BY Xi_R, THE FOLLOWING CALCULATION EXPRESSION IS OBTAINED.
sqrt() IS FUNCTION THAT RETURNS SQUARE ROOT.

EXPRESSION 4)

for(from i = 1 to i = n)
{
    Xi = (Xi_L + Xi_R)/2

EXPRESSION 5)

$$rms = sqrt((\sum_{i=1}^{n}(Xi*Xi))/n)$$
}

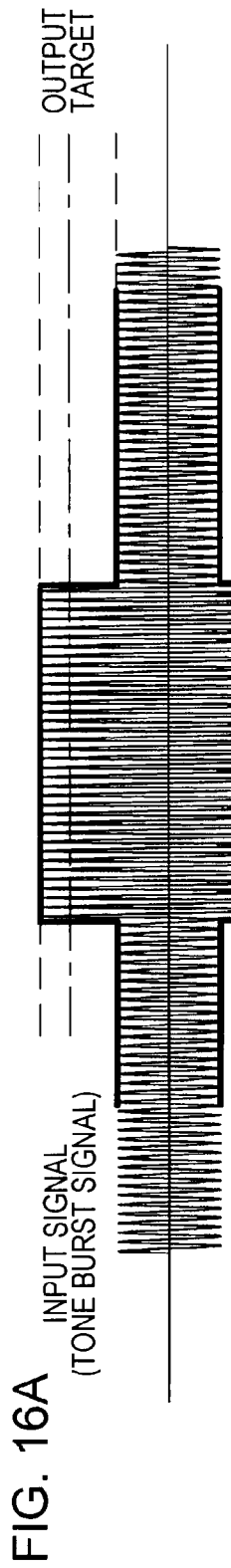
FIG. 16A  INPUT SIGNAL (TONE BURST SIGNAL)
FIG. 16B  CONTROL SIGNAL GENERATED IN COMPRESSOR (ENVELOPE SIGNAL)
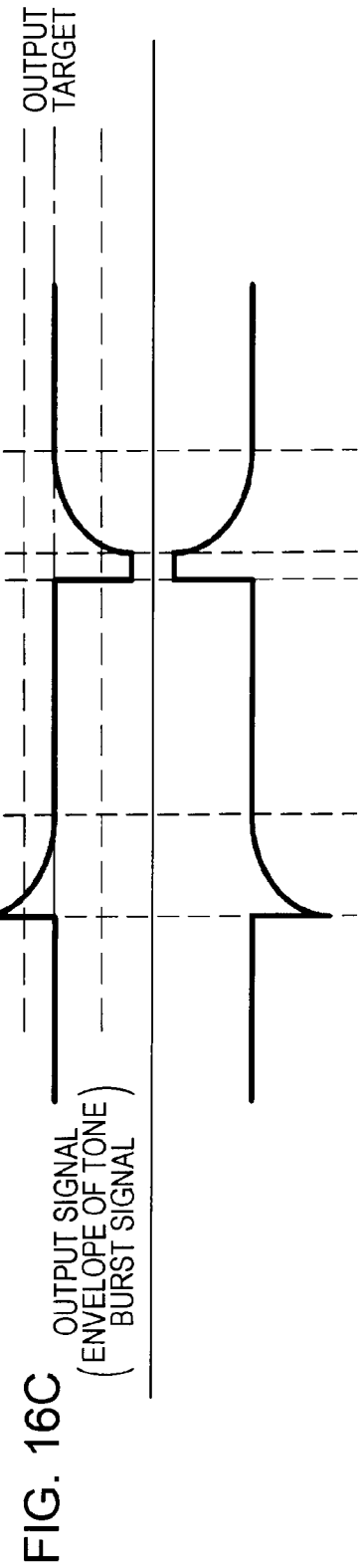
FIG. 16C  OUTPUT SIGNAL (ENVELOPE OF TONE BURST SIGNAL)

REPRODUCTION APPARATUS, REPRODUCTION METHOD, PROVISION APPARATUS, AND REPRODUCTION SYSTEM

BACKGROUND

The present disclosure relates to a reproduction apparatus, a reproduction method, a provision apparatus, and a reproduction system.

In recent years, with an increase in the capacity of storage devices such as an HDD (Hard Disk Drive), even in an ordinary environment or the like in which a user listens to music tracks using a portable device or the like, an environment in which a large number of music tracks are easily stored in the portable device or the like is provided. However, in a case where the large number of music tracks are sequentially reproduced, because the recording states of the music tracks are different or the like, a situation in which the volumes of the music tracks do not fit into a desired range, but the volumes of some music tracks are too high and the volumes of other music tracks are too low, or the like, may occur.

Moreover, recently, with the popularization of high-speed networks such as ADSL (Asymmetric Digital Subscriber Line) or optical fiber, an environment in which even a PC (Personal Computer) or the like that is present in a normal house is connected to a music server on a network to stream and reproduce music tracks continuously has been provided. Similarly, in this environment, a situation in which the volumes of some music tracks are too high and the volumes of other music tracks are too small, or the like, may occur.

In the situation, it is difficult for a user to listen to the music tracks in comfort, and an operation of adjusting the volume of the music track is cumbersome for the user. In order to improve such a situation, an automatic volume correction apparatus called a normalizer has been proposed. The automatic volume correction apparatus automatically corrects the volume during reproduction of each music track (For example, see Japanese Unexamined Patent Application Publication No. 2001-320793).

SUMMARY

However, generally, there is a problem in that in order to dynamically control the volume of a music track so as to cause the volume of the music track to fit into a predetermined target level, the normalizer may not faithfully reproduce the volume curve of the original music track regarding the music track during reproduction. For example, even a music track of which a portion near the start has a low volume and the volume is sharply increased during reproduction is reproduced at a predetermined volume level. It is apparent that during reproduction of the music track, the volume curve intended by a composer or a recording artist of the music track may not be obtained. The same problem occurs even with sound data other than music tracks.

In addition, during reproduction of the music track, the volume of the music track may be unnecessarily amplified during reproduction, and thus audio distortion due to the amplification easily occurs, so that there is a problem in that the sound quality of the music track is degraded. The same problem occurs even with sound data other than music tracks.

It is desirable to provide a new or improved technique capable of reducing the difference between the volumes of sound data while maintaining a change in volume which is relatively close to a change in the volume of original sound data, thereby reproducing the sound data while reducing audio distortion due to volume amplification.

A reproduction apparatus according to an embodiment of the present disclosure includes: a reproduction unit which reproduces sound data; and a volume correction unit which corrects a volume of the sound data reproduced by the reproduction unit on the basis of a relationship between a volume characteristic value of each of a plurality of pieces of sound data and a volume characteristic value of the sound data.

The reproduction apparatus may further include a parameter calculation unit which calculates a parameter for volume correction on the basis of the relationship between the volume characteristic value of each of the plurality of pieces of sound data and the volume characteristic value of the sound data, and the volume correction unit may correct the volume of the sound data according to the parameter calculated by the parameter calculation unit.

The volume characteristic value may represent a volume average value of the sound data, the parameter calculation unit may calculate a parameter for amplifying the volume of the sound data in a case where the volume average value of the sound data is lower than a reference average value determined on the basis of a distribution of the volume average value of the plurality of pieces of sound data, and the parameter calculation unit may calculate a parameter for attenuating the volume of the sound data in a case where the volume average value of the sound data is higher than the reference average value.

The volume correction unit may have a nonlinear correction unit and a first linear correction unit, and the parameter calculation unit may calculate a parameter for linear correction set by the first linear correction unit, and a parameter for nonlinear correction set by the nonlinear correction unit.

The parameter calculation unit may calculate a ratio of a volume upper limit to a volume peak value of the sound data as the parameter for linear correction in the case where the volume average value of the sound data is lower than the reference average value, and calculate the parameter for nonlinear correction on the basis of a ratio of the reference average value to the volume average value of the sound data.

The parameter calculation unit may calculate the ratio of the reference average value to the volume average value of the sound data as the parameter for linear correction in the case where the volume average value of the sound data is higher than the reference average value.

The parameter calculation unit may calculate the parameter for amplifying the volume of the sound data in a case where the volume average value of the sound data is lower than a lower reference value that is lower than the reference average value, the parameter calculation unit may calculate the parameter for attenuating the volume of the sound data in a case where the volume average value of the sound data is higher than an upper reference value that is higher than the reference average value, and the parameter calculation unit may set a parameter for subjecting the sound data to through-output in a case where the volume average value of the sound data is included between the lower reference value and the upper reference value.

The volume correction unit may have a second linear correction unit connected in parallel to the nonlinear correction unit at a rear end of the first linear correction unit and the parameter calculation unit may set the parameter for subjecting the sound data to through-output to an amplification factor of 1 in the first and second linear correction units, and sets the parameter for nonlinear correction to an amplification factor of 0.

As described above, according to the embodiment of the present disclosure, it is possible to reduce a difference between the volumes of pieces of sound data while maintaining a change in volume which is relatively close to a change in the volume of original sound data, thereby reproducing the sound data while reducing audio distortion due to volume amplification.

BRIEF DESCRIPTION OF THE DRAWINGS

FIG. 4 is a diagram for explaining a Peak value and an RMS value as an example of volume characteristic values according to the embodiment of the present disclosure.

FIG. 5 is a diagram showing a calculation example of the Peak value as the example of the volume characteristic value according to the embodiment of the present disclosure.

FIG. 6 is a diagram showing a calculation example of the RMS value as the example of the volume characteristic value according to the embodiment of the present disclosure.

FIG. 16 is a diagram showing an example of dynamic characteristics of the compressor circuit which can be applied to the reproduction apparatus according to the embodiment of the present disclosure.

FIG. 22 is a diagram illustrating a statistical distribution of RMS values as an example of the volume characteristic value according to the embodiment of the present disclosure.

DETAILED DESCRIPTION OF EMBODIMENTS

Figure 1:
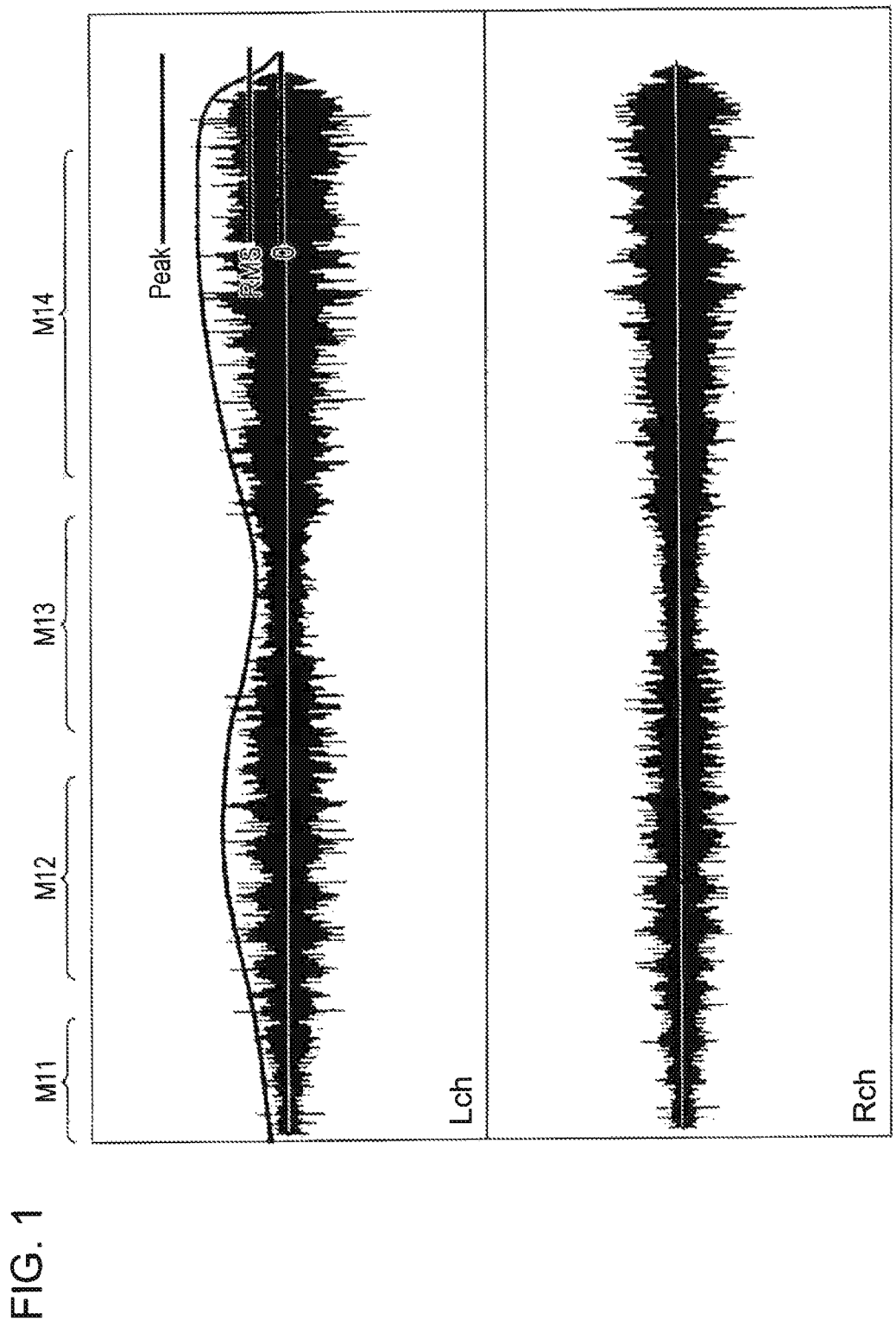
FIG. 1 is a diagram showing an example of audio waveforms obtained by reproducing sound data.

Exemplary embodiments of the present disclosure will now be described in detail with reference to the accompanying drawings. In addition, throughout the specification and the drawings, like elements having substantially the same functional configurations are denoted by like reference numerals, and overlapping description thereof will be omitted.

In addition, "DETAILED DESCRIPTION OF EMBODIMENTS" will be provided in the following order:
 1. Embodiment
 1-1. Audio Waveforms Obtained by Reproducing Sound Data
 1-2. Volume Correction by Ordinary Volume Correction Technique
 1-3. Volume Correction by Reproduction Apparatus According to Embodiment of the Present Disclosure
 1-4. Peak Value and RMS Value as Example of Volume Characteristic Value
 1-5. Calculation Example of Peak Value as Example of Volume Characteristic Value
 1-6. Calculation Example of RMS Value as Example of Volume Characteristic Value
 1-7. Hardware Configuration of Reproduction Apparatus
 1-8. Functional Configuration of Reproduction System
 1-9. Example of Management Method of Attribute Information 1-10. Another Example of Management Method of Attribute Information
1-11. Process Executed by Reproduction System
1-12. Compressor Circuit That Can Be Applied to Volume Correction of Sound Data
1-13. Example of Static Characteristics (During Volume Amplification) of Compressor Circuit
1-14. Example of Static Characteristics (During Volume Attenuation) of Compressor Circuit
1-15. Another Example of Static Characteristics (During Volume Amplification) of Compressor Circuit
1-16. Example of Dynamic Characteristics of Compressor Circuit
1-17. Example of Generation Method of Control Signal In Compressor Circuit
1-18. Details of Flow of Volume Correction Process of Sound Data
1-19. Calculation Example of Parameter (During Volume Amplification) by Parameter Calculation Unit
1-20. Calculation Example of Parameter (During Volume Attenuation) by Parameter Calculation Unit
1-21. Calculation Example of Parameter (During Through-Output) by Parameter Calculation Unit
1-22. Statistical Distribution of Peak Value as Example of Volume Characteristic Value 1-23. Statistical Distribution of RMS Value as Example of Volume Characteristic Value
1-24. Example of Determination Method of RMS Reference Value
1-25. Another Example of Determination Method of RMS Reference Value
2. Usage Example
3. Modified Example
4. Conclusions
1. Embodiment
1-1. Audio Waveforms Obtained by Reproducing Sound Data FIG. 1 is a diagram showing an example of audio waveforms obtained by reproducing sound data. Referring to FIG. 1, an example of audio waveforms obtained by reproducing sound data will be described. In addition, in FIG. 1, lines of a Peak value and an RMS (Root Mean Square) value of an audio waveform are shown, and the Peak value and the RMS value may be used as an example of volume characteristics in an embodiment of the present disclosure. In addition, the RMS value is used as an example of a volume average value.

The audio waveforms obtained by reproducing certain sound data are as shown in FIG. 1. Here, the waveform shown on the upper side from the waveforms shown in FIG. 1 represents an audio waveform output from Lch by a method of outputting audio obtained by reproducing sound data in both left (Lch) and right (Rch) directions of a speaker (hereinafter, also called a "stereo audio method"). In addition, the waveform shown on the lower side from the waveforms shown in FIG. 1 represents an audio waveform output from Rch using the stereo audio method. Correction of the sound data was not performed.

The audio waveform shown in FIG. 1 is obtained by reproducing sound data recorded by the same recording method as that of sound data recorded by a CD-DA format (Compact Disc Digital Audio). In the CD-DA format, sound data is recorded at a sampling frequency of 44.1 kHz and a quantization bit rate of 16 bits by a stereo PCM (Pulse Code Modulation) format.

In the case where sound data is recorded at the quantization bit rate of 16 bits using the PCM format, the sound data is expressed by 2 complementary codes including a 1 bit symbol and 15 bits of data. The maximum value (or the minimum value) of the audio volume (amplification value) that can be expressed by the sound data is +32767 on the positive side and −32768 on the negative side. Audio at a volume that exceeds the range from the minimum value to the maximum value may be rounded to the maximum value (or the minimum value). However, as a result, there is a possibility of generating unpleasant distortion called clip noise.

On the other hand, in the case where audio with too low a volume is recorded as sound data, the 16 bits information amount is not all used, and audio with a good S/N is not obtained as a result of sound data reproduction. Therefore, in a case where a music track is used as an example of sound data, the creator of the music track records the music track while adjusting the volume using a device such as a mixer so that the volume fits into the range expressed by 16 bits throughout a single music track.

However, like the music track having the audio waveform shown in FIG. 1, there may be cases where in a commercially available CD or music file, a music track is recorded where the volume throughout does not reach the maximum value of a value that can be represented by 16 bits. There are various reasons why such a music track is recorded, and generally, there is such a tendency for such music tracks to have been recorded in older eras in which the recording technology was not developed.

The example shown in FIG. 1 is an audio waveform of a classical music track with a relatively low volume compared to other music tracks. In a case where such a classical music track is reproduced individually, the volume is not such a concern. However, in a case where such a classical music track is reproduced before and after music tracks with relatively high volumes, the volume of the classical music track becomes relatively low, so that there is a high possibility that the low level of the volume being felt. Therefore, of may be a situation in which the volume of only the classical music track is desired to be increased.

In a case where the audio file shown in FIG. 1 is divided into audio waveform parts M11 to M14, the audio waveform part M11 is a quiet part, the audio waveform part M12 is a gradually building part, the audio waveform part M13 is a quiet part, and the audio waveform part M14 is a building part. As described above, the audio waveform shown in FIG. 1 is obtained by reproducing the classical music track, and it is assumed that an impression of the volume being generally low is easily provided to a listener. There, when the classical music track is reproduced, it is thought that the overall audio volume has to be increased.

1-2. Volume Correction by Ordinary Volume Correction Technique

Figure 2:
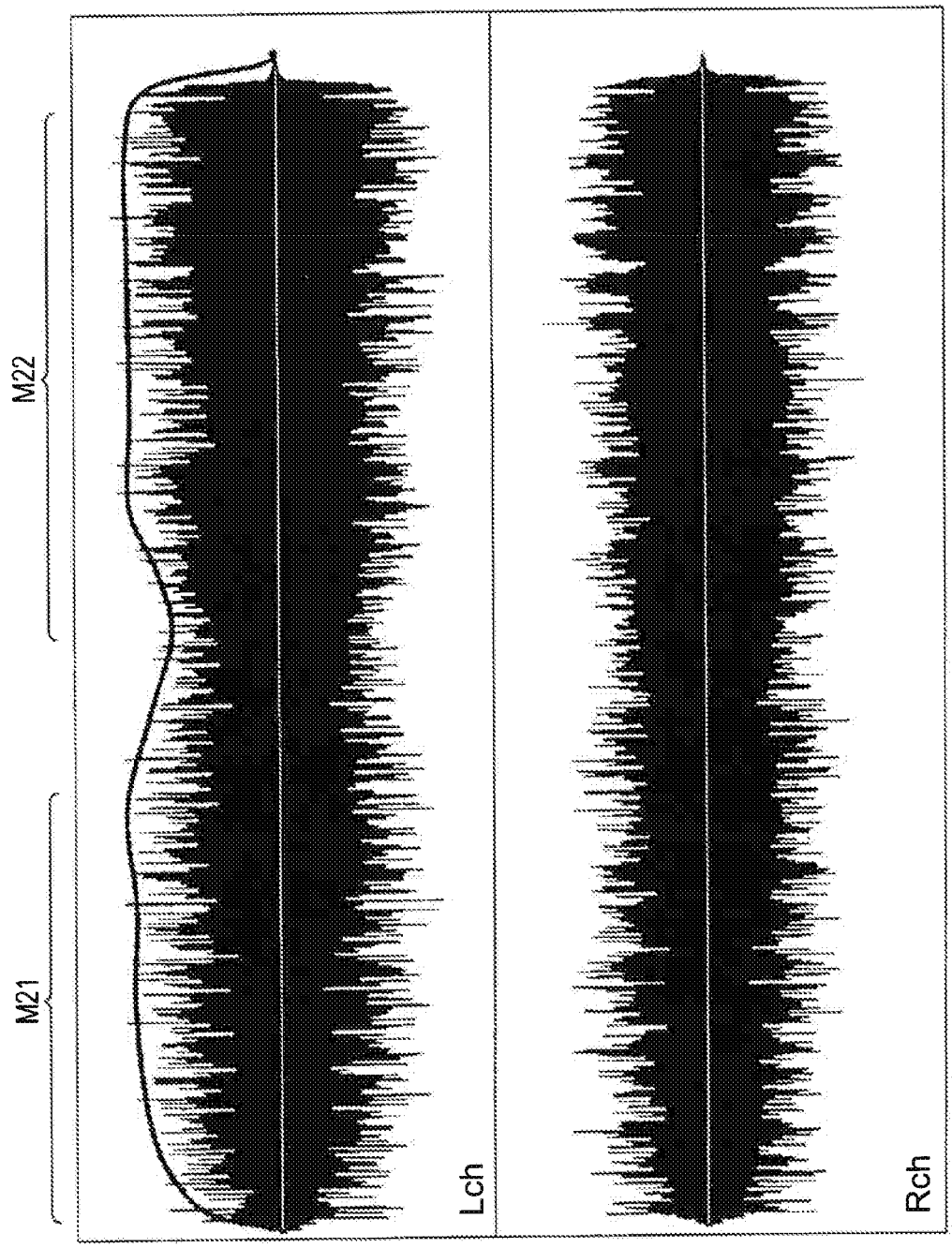
FIG. 2 is a diagram showing an example of audio waveforms obtained by reproducing sound data in a case where volume correction using an ordinary volume correction technique is applied to the sound data.

FIG. 2 is a diagram showing an example of audio waveforms obtained by reproducing sound data in a case where volume correction using an ordinary volume correction technique is applied to the sound data. Referring to FIG. 2, the example of audio waveforms obtained by reproducing sound data in the case where volume correction using an ordinary volume correction technique is applied to the sound data will be described.

When the audio waveform shown in FIG. 2 is divided into audio waveform parts M21 and M22, the audio waveform part M21 is a part that builds at once, and the audio waveform part M22 is a part that only builds without accents. As shown in FIG. 2, through the volume correction using the ordinary volume correction technique, the volume of the classical music track is increased. However, the change in volume (hereinafter, also called a "volume curve") of the original music track are not maintained, resulting in that an unnatural feeling is provided to a listener.

In addition, by the volume correction using the ordinary volume correction technique, audio distortion that may not be perceived from the audio waveform shown in FIG. 2 also occurs. One of reasons that an unnatural feeling is provided to the listener is that the volume amplification is not perform in consideration of the entire audio waveform, and partially appropriate volume amplification is performed in consideration of parts of the audio waveform.

Figure 3:
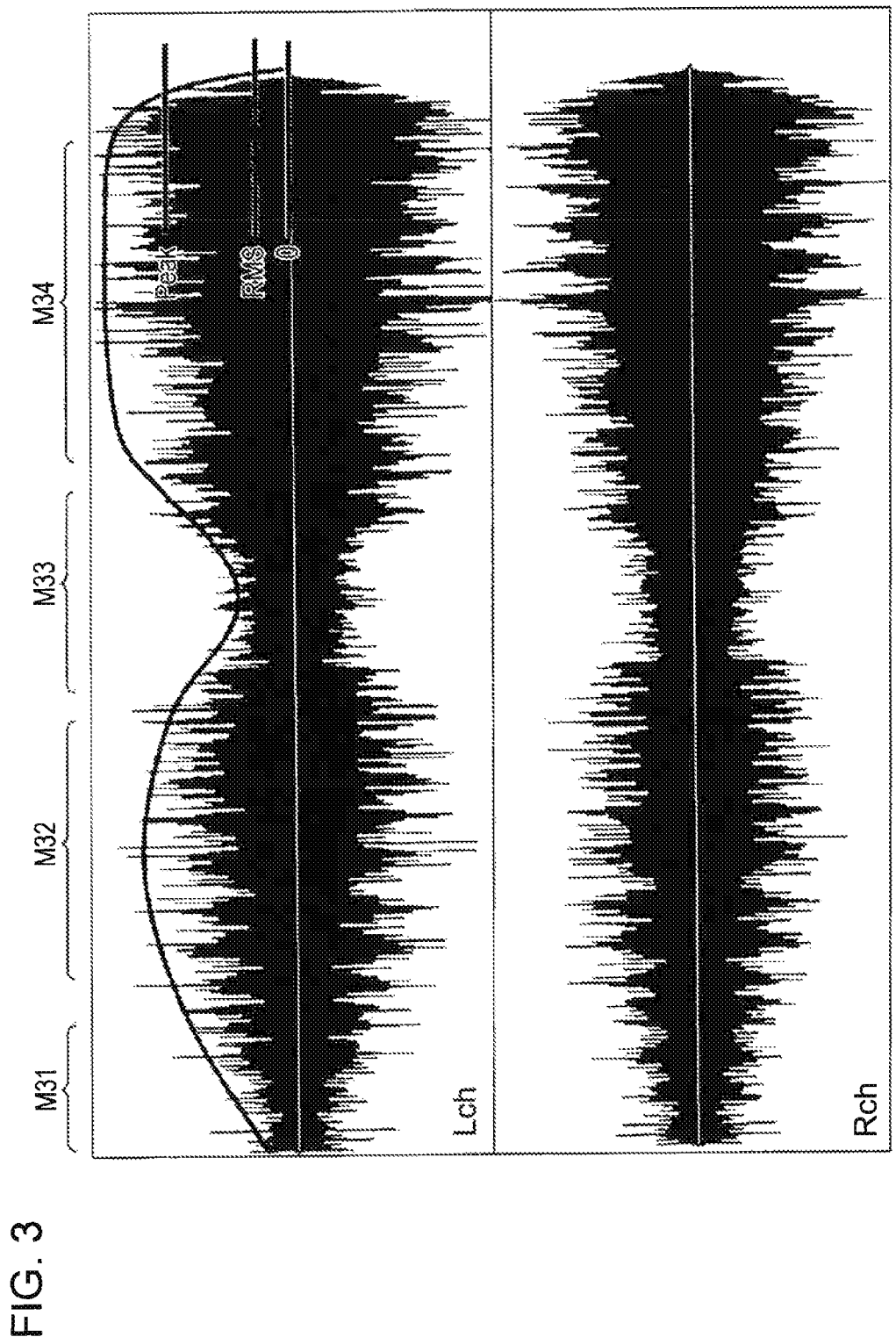
FIG. 3 is a diagram showing an example of audio waveforms obtained by reproducing sound data in a case where volume correction using a reproduction apparatus according to an embodiment of the present disclosure is applied to the sound data.

1-3. Volume Correction by Reproduction Apparatus According to Embodiment of the Present Disclosure FIG. 3 is a diagram showing an example of audio waveforms obtained by reproducing sound data in a case where volume correction using a reproduction apparatus according to the embodiment of the present disclosure is applied to the sound data. Referring to FIG. 3, an example of audio waveforms obtained by reproducing sound data in the case where volume correction using the reproduction apparatus according to the embodiment of the present disclosure is applied to the sound data will be described.

When the audio waveforms shown in FIG. 3 are divided into audio waveform parts M31, M32, M33, and M34, the audio waveform part M31 is a quiet part, the audio waveform part M32 is a gradually building part, the audio waveform part M33 is a quiet part, and the audio waveform part M34 is a gradually building part. As shown in FIG. 3, by the volume correction using the reproduction apparatus according to the embodiment of the present disclosure, the volume of the classical music track is increased, and the volume curve of the original music track is maintained.

In addition, by the volume correction using the reproduction apparatus according to the embodiment of the present disclosure, audio distortion can also be reduced. One of reasons that volume correction by which a natural feeling is provided to the listener can be made is that the volume correction is performed in consideration of the entire audio waveforms. In order to perform volume amplification in consideration of the entire audio waveforms, for example, metadata such as the Peak value and the RMS value may be used. The metadata such as Peak value and the RMS value may be held on, for example, a server to be downloaded by the reproduction apparatus for use.

1-4. Peak Value and RMS Value as Example of Volume Characteristic Value

FIG. 4 is a diagram for explaining the Peak value and the RMS value as an example of volume characteristic values according to the embodiment of the present disclosure. Referring to FIG. 4, the Peak value and the RMS value as an example of volume characteristic values according to the embodiment of the present disclosure will be described.

As shown in FIG. 4, it is assumed that a music track which has loud sound such as sudden impact sound at only a single point and only singing voice at the other points is recorded. Such a music track is generally called sound with a wide dynamic range. Since the volume of the impact sound corresponds to the maximum volume and corresponds to the maximum value of a value that can be represented by 16 bits, audio other than the impact sound has to be recorded by relatively reducing the volume.

For example, in a case where the Peak value of the impact sound is +32767, if the volume of a singing voice or the like corresponding to audio other than the impact sound is not recorded by reducing the Peak value by about +1000, the entire music track does not fit into 16 bits. In such a case, it feels that the volume of the singing voice corresponding to the audio other than the impact sound is relatively very low.

From the background, a reproduction system according to the embodiment of the present disclosure holds, for example, the Peak value and the RMS value, a total of two values as feature amounts representing the volume of the music track. It is said that the Peak value is appropriate to be used as a feature amount representing the volume level when a sudden volume change that appears in a single music track occurs. In the example shown in FIG. 4, it is said that the Peak value is appropriate to represent the volume level of the impact sound. In addition, it is said that the RMS value represents a time-averaged integral value for the power that the audio of the music track has and is appropriate to be used as a feature amount representing the average volume level of the entire music track. In the example shown in FIG. 4, the RMS value becomes a feature amount mainly representing the volume level of a singing voice corresponding to audio other than the impact sound.

1-5. Calculation Example of Peak Value as Example of Volume Characteristic Value FIG. 5 is a diagram showing a calculation example of the Peak value as the example of the volume characteristic value according to the embodiment of the present disclosure. Referring to FIG. 5, a calculation example of the Peak value as the example of the volume characteristic value according to the embodiment of the present disclosure will be described.

When a single music track as the example of the sound data is reproduced as monaural audio, for example, by performing calculation using a function such as Expression 1 shown in FIG. 5, the Peak value is stored in a variable Peak. In addition, when a single music track as the example of the sound data is reproduced as stereo audio, for example, by performing calculation using a function such as Expression 2 shown in FIG. 5, the Peak value is stored in a variable Peak. The reproduction system according to the embodiment of the present disclosure may store the Peak value in the variable Peak, for example, by the calculation and use the Peak value stored in the variable Peak as the example of the volume characteristic value.

1-6. Calculation Example of RMS Value as Example of Volume Characteristic Value

FIG. 6 is a diagram showing a calculation example of the Peak value as the example of the volume characteristic value according to the embodiment of the present disclosure. Referring to FIG. 6, a calculation example of the Peak value as the example of the volume characteristic value according to the embodiment of the present disclosure will be described.

When a single music track as the example of the sound data is reproduced as monaural audio, for example, by performing calculation using a function such as Expression 3 shown in FIG. 6, the RMS value is stored in a variable RMS. In addition, when a single music track as the example of the sound data is reproduced as stereo audio, for example, by performing calculation using a function such as Expression 5 shown in FIG. 6, the RMS value is stored in a variable RMS. The reproduction system according to the embodiment of the present disclosure may store the RMS value in the variable RMS, for example, by the calculation and use the RMS value stored in the variable RMS as the example of the volume characteristic value.

1-7. Hardware Configuration of Reproduction Apparatus

Figure 7:
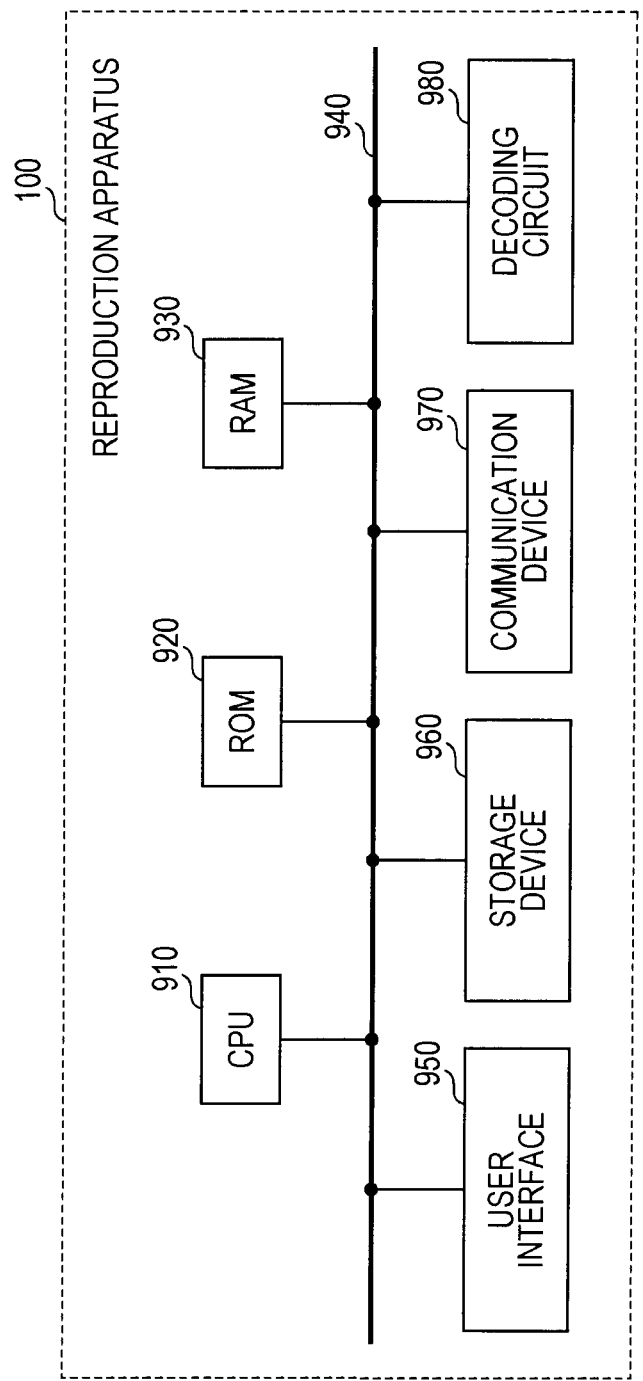
FIG. 7 is a diagram showing the hardware configuration of the reproduction apparatus according to the embodiment of the present disclosure.

FIG. 7 is a diagram showing an example of the hardware configuration of the reproduction apparatus according to the embodiment of the present disclosure. Referring to FIG. 7, an example of the hardware configuration of the reproduction apparatus according to the embodiment of the present disclosure will be described.

As shown in FIG. 7, the reproduction apparatus 100 according to the embodiment of the present disclosure includes, for example, a CPU (Central Processing Unit) 910, a ROM (Read Only Memory) 920, a RAM (Random Access Memory) 930, a bus 940, a user interface 950, a storage device 960, a communication device 970, and a decoding circuit 980.

The CPU 910 may function as a computation processing device and a control device, read various programs stored in, for example, the ROM 920 and store the programs in the storage device 960, develop the various programs stored in the storage device 960 on the RAM 930 when executing the various programs, and execute the various programs developed on the RAM 930. It is possible to control the entirety or a part of the operations in the reproduction apparatus 100 by executing the various programs.

The ROM 920 is a read-only memory, and may store various programs read by, for example, the CPU 910, parameters used for executing the programs, and the like.

The RAM 930 may temporarily store various programs read by the CPU 910 from the storage device 960, parameters used for executing the programs, and the like. In addition, the RAM 930 may also store various types of data that have to be temporarily stored when the various programs are executed by the CPU 910.

The bus 940 is connected to each units of hardware installed in the reproduction apparatus 100 and functions to realize transmission and reception signals between the units of hardware.

The user interface 950 is configured as an input device. For example, the user interface 950 is configured as a mouse, a keyboard, a touch panel, a button, a switch, a lever, or the like and has a function of receiving an operation from the user. The input device generates an input signal on the basis of, for example, the received operation to be output to the CPU 910. A person who listens to audio obtained by reproducing sound data may input various types of data to the reproduction apparatus 100 or instructs the reproduction apparatus 100 to perform a processing operation by operating, for example, the input device.

The storage device 960 is a device for data storage, and is configured as, for example, a magnetic memory device such as an HDD, a semiconductor memory device, an optical memory device, a magneto-optical memory device, or the like. The storage device 960 may store sound data, image data, and the like acquired externally. The storage device 960 has a function of storing, for example, various programs read from the ROM 920 by the CPU 910 or the like.

The communication device 970 is, for example, a communication interface configured as a communication device or the like for connection to a network. The communication device 970 is configured as, for example, a communication card for a wired or wireless LAN (Local Area Network), a router for ADSL (Asymmetric Digital Subscriber Line), or various modems for communication. The communication device 970, for example, may transmit or receive data such as sound data to or from other communication devices. In addition, the network connected to the communication device 970 is configured as a network or the like connected in wired or wirelessly and may be, for example, Internet, a LAN in a house, or the like.

The decoding circuit 980 has a function of decoding encoded sound data and reproducing the sound data. The decoding circuit 980 may also have a function of decoding encoded image data and reproducing the image data.

The example of the hardware configuration that can realize the function of the reproduction apparatus 100 according to the embodiment of the disclosure has been described above. The components may be configured using general-purpose members or may also be configured by hardware specialized for the function of each component.

Therefore, according to the technology level applied when embodying the reproduction apparatus 100 according to the embodiment of the present disclosure, the used hardware configuration may be appropriately changed.

1-8. Functional Configuration of Reproduction System

Figure 8:
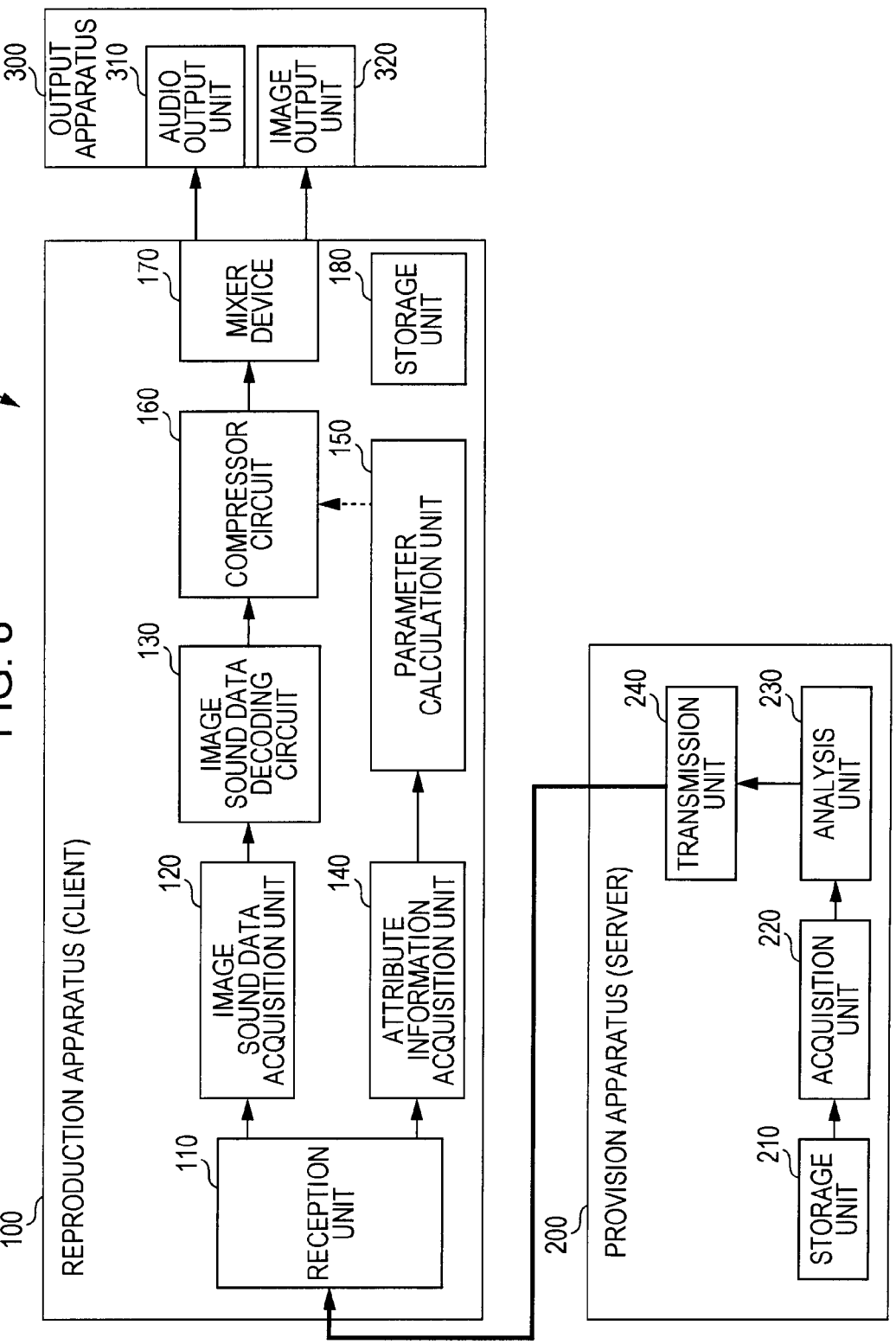
FIG. 8 is a diagram showing the functional configuration of the reproduction system according to the embodiment of the present disclosure.

FIG. 8 is a diagram showing the functional configuration of the reproduction system according to the embodiment of the present disclosure. Referring to FIG. 8, the functional configuration of the reproduction system according to the embodiment of the present disclosure will be described.

As shown in FIG. 8, the reproduction system 10 according to the embodiment of the present disclosure includes the reproduction apparatus 100, a provision apparatus 200, and an output apparatus 300. The reproduction apparatus 100 and the provision apparatus 200 are connected via, for example, a network and can communicate with each other. The reproduction apparatus 100 and the output apparatus 300 are connected by, for example, a dedicated line, and the output apparatus 300 can output an audio signal output from the reproduction apparatus 100 as audio. In addition, the output apparatus 300 can output an image signal output from the reproduction apparatus 100 as an image.

The reproduction apparatus 100 at least includes, an image sound data decoding circuit 130 (hereinafter, also simply called an "image sound data decoding circuit 130") as an example of a reproduction unit, and a compressor circuit 160 (hereinafter, also simply called a "compressor circuit 160") as an example of a volume correction unit. Here, the reproduction apparatus 100 includes the image sound data decoding circuit 130, and the image sound data decoding circuit 130 decodes and reproduces both the encoded image data and encoded sound data. However, the reproduction unit of the reproduction apparatus 100 may not have a function of decoding and reproducing the encoded image data. The image sound data decoding circuit 130 is configured as, for example, the decoding circuit 980.

The compressor circuit 160 has a function of correcting the volume of the sound data (hereinafter, also called "reproduction object sound data") reproduced by the image sound data decoding circuit 130 on the basis of a relationship between the volume characteristic value of each of a plurality of pieces of sound data and the volume characteristic value of the reproduction object sound data. The plurality of pieces of sound data is not particularly limited and may include or may not include the reproduction object sound data. As the volume characteristic value, the Peak value, the RMS value, or the like may be exemplified.

The reproduction apparatus 100 includes the image sound data decoding circuit 130 and the compressor circuit 160, and thus reduces a difference between the volumes of the pieces of sound data while maintaining a change in the volume which is relatively close to a change in the volume of the original sound data, thereby reproducing the sound data while reducing audio distortion due to volume amplification.

The reproduction apparatus 100 may include a parameter calculation unit 150. The parameter calculation unit 150 has a function of calculating parameters for volume correction on the basis of the relationship between the volume characteristic value of each of the plurality of pieces of sound data and the volume characteristic value of the sound data. The parameters for volume correction are used for volume correction of the sound data in the compressor circuit 160. That is, the compressor circuit 160 corrects the volume of the reproduction object sound data according to the parameter calculated by the parameter calculation unit 150.

The reproduction apparatus 100 may include a reception unit 110, an image sound data acquisition unit 120, the image sound data decoding circuit 130, an attribute information acquisition unit 140, a mixer device 170, a storage unit 180, and the like. The reception unit 110 can receive the volume characteristic value of each of the plurality of pieces sound data, the volume characteristic value of the reproduction object sound data, the reproduction object sound data itself, and the like from the provision apparatus 200. However, the volume characteristic value of each of the plurality of pieces of sound data, the volume characteristic value of the production object sound data, the reproduction object sound data itself, and the like may not be received from the provision apparatus 200, and those stored in the storage unit 180 included in the apparatus 100 may be used in the reproduction apparatus 100. The reception unit 110 may receive image data from the provision apparatus 200. The reception unit 110 is configured by, for example, the communication device 970.

The image sound data acquisition unit 120 has a function of acquiring, from the reception unit 110, the reproduction object sound data received by the reception unit 110. The image sound data acquisition unit 120 further has a function of outputting the acquired reproduction object sound data to the image sound data decoding circuit 130. In the case where image data is received by the reception unit 110, the image sound data acquisition unit 120 may have a function of acquiring the image data from the reception unit 110. In this case, the image sound data acquisition unit 120 further has a function outputting the image data acquired from the reception unit 110 to the image sound data decoding circuit 130. The reproduction object sound data or the image data output from the image sound data decoding circuit 130 is used in the image sound data decoding circuit 130.

The attribute information acquisition unit 140 has a function of acquiring, from the reception unit 110, the volume characteristic value of the reproduction object sound data received by the reception unit 110. The attribute information acquisition unit 140 further has a function of outputting the volume characteristic value of the reproduction object sound data received by the reception unit 110 to the parameter calculation unit 150. The volume characteristic value of the reproduction object sound data output from the parameter calculation unit 150 is used in the parameter calculation unit 150. The parameter calculation unit 150 may receive the volume characteristic value of the reproduction object sound data from the attribute information acquisition unit 140 as attribute information (also called "metadata" hereinafter) of the reproduction object sound data.

The mixer device 170 has a function of synthesizing the reproduction object sound data and image data output from the compressor circuit 160. The volume of the reproduction object sound data output from the compressor circuit 160 is corrected if necessary. The mixer device 170 outputs the synthesized signal that synthesizes the reproduction object sound data and the image data to the output apparatus 300.

The reproduction apparatus 100 may further include the storage unit 180. The storage unit 180 is configured by, for example, the storage device 960. The storage unit 180 has a function of storing various programs for controlling the operation of each function block included in the reproduction apparatus 100 or a function of storing various types of data and the like used for executing the programs.

The image sound data acquisition unit 120, the attribute information acquisition unit 140, the parameter calculation unit 150, and the like may be configured by, for example, the CPU 910, the RAM 930, and the like, and the functions are realized as the CPU 910 develops and executes the programs stored by the storage unit 180 on the RAM 930. However, the embodiment is not limited to the configuration, and from among the image sound data acquisition unit 120, the attribute information acquisition unit 140, and the parameter calculation unit 150, those configured by a dedicated hardware may exist.

The provision apparatus 200 at least includes a storage unit 210, an acquisition unit 220, an analysis unit 230, and a transmission unit 240. The storage unit 210 is configured by, for example, a storage device. The storage unit 180 has a function of storing various programs for controlling the operation of each of function blocks constituting the provision apparatus 200 or a function of string various types of data and the like used for executing the programs. The storage unit 180 may have a function of storing, for example, the volume characteristic value of each of the plurality of pieces of sound data. In addition, the storage unit 180 may also have a function of storing the reproduction object sound data.

The acquisition unit 220 has a function of acquiring of the volume characteristic value of each of the plurality of pieces of sound data. The acquisition unit 220 acquires, for example, the volume characteristic value of each of the plurality of pieces of sound data stored in the storage unit 180. As the volume characteristic value of each of the plurality of pieces of sound data, for example, the RMS value of each of the plurality of pieces of sound data may be used. In addition, the acquisition unit 220 has a function of acquiring the reproduction object sound data. The acquisition unit 220 acquires, for example, the reproduction object sound data stored in the storage unit 180.

The analysis unit 230 has a function analyzing a distribution of the volume characteristic values of the plurality of pieces of sound data acquired by the acquisition unit 220. As the distribution of the volume characteristic values of the plurality of pieces of sound data, for example, a distribution of the RMS values of the plurality of pieces of sound data may be used. The analysis unit 230 may calculate an RMS reference value as an analysis result by analyzing the distribution of the sound characteristic values of the plurality of pieces of sound data. A calculation method of the RMS reference value will be described later in detail. The result obtained by analyzing the distribution of the volume characteristic values of the plurality of pieces of sound data by the analysis unit 230 is output to the transmission unit 240 as an example of the analysis result. The RMS reference value is an example of a reference average value.

In addition, the analysis unit 230 further has a function of analyzing the reproduction object sound data acquired by the acquisition unit 220. The analysis unit 230 may calculate the volume characteristic value of the reproduction object sound data by analyzing the reproduction object sound data. In addition, the analysis unit 230 may calculate the RMS value of the reproduction object sound data as an example of the volume characteristic value of the reproduction object sound data. The analysis unit 230 may store the volume characteristic value of the reproduction object sound obtained by such analysis in the storage unit 210 as, for example, the attribute information of the reproduction object sound data so as to acquire the attribute information from the storage unit 210 if necessary. The result obtained by analyzing the reproduction object sound data by the analysis unit 230 is output to the transmission unit 240 as an example of the analysis result.

Here, the analysis unit 230 outputs a result obtained by analyzing the distribution of the sound characteristic values of the plurality of pieces of sound data, and the result obtained by analyzing the reproduction object sound data, to the transmission unit 240 as the analysis result. However, the analysis unit 230 may further perform analysis using the analysis result and may output an analysis result obtained as a result to the transmission unit 240. For example, the analysis unit 230 may calculate a parameter for volume correction as the result of the further analysis. In this case, the corresponding parameter may be output to the transmission unit 240 as an example of the analysis result. The parameter for volume correction will be described later in detail.

The transmission unit 240 has a function of transmitting the reproduction object sound data and the analysis result by the analysis unit 230 to the reproduction apparatus 100 that reproduces the reproduction object sound data. The transmission unit 240 may transmit, for example, the reproduction object sound data acquired from the storage unit 210 by the acquisition unit 220 to the reproduction apparatus 100. The transmission unit 240 is configured by, for example, the communication device. In a case where image data is stored by the storage unit 210, the transmission unit 240 transmits the image data stored by the storage unit 210 to the reproduction apparatus 100 to be reproduced.

The acquisition unit 220, the analysis unit 230, and the like may be configured by, for example, the CPU, the RAM, and the like, and the functions are realized as the CPU develops and executes the programs stored by the storage unit 210 on the RAM. However, the embodiment is not limited to the configuration, and from the acquisition unit 220 and the analysis unit 230, those configured by a dedicated hardware may exist.

The output apparatus 300 at least includes an audio output unit 310. The audio output unit 310 is configured by, for example, a speaker or headphones. The audio output unit 310 has a function of converting the sound data reproduced by the image sound data decoding circuit 130 into an analog signal to be output. The output apparatus 300 may have an image output unit 320. The image output unit 320 is configured by, for example, a display device. The image output unit 320 has a function of converting the image data reproduced by the image sound data decoding circuit 130 into an analog signal to be output.

1-9. Example of Management Method of Attribute Information

Figure 9:
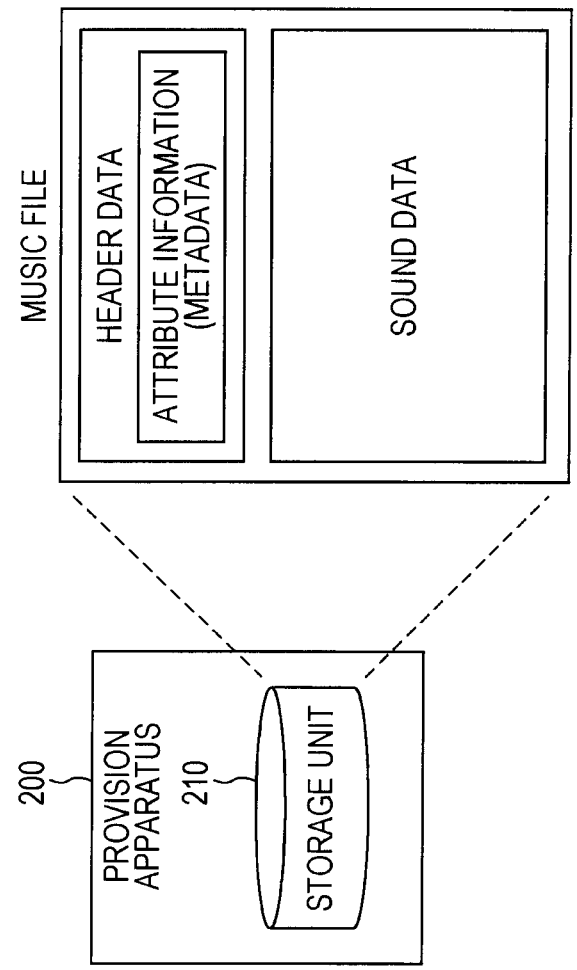
FIG. 9 is a diagram illustrating an example of a management method of attribute information according to the embodiment of the present disclosure.

FIG. 9 is a diagram illustrating an example of a management method of attribute information according to the embodiment of the present disclosure. Referring to FIG. 9, an example of the management method of the attribute information according to the embodiment of the present disclosure will be described.

As shown in FIG. 9, the attribute information of the reproduction object sound data may be embedded into the same music file as the reproduction object sound data stored in the storage unit 210 included in the provision apparatus 200 as header data. The analysis unit 230 may embed, for example, the analysis result as the attribute information into the music file as the header data. Then, the provision apparatus 200 acquires the music file into which the attribute information is embedded using the acquisition unit 220 in response to a request of the reproduction apparatus 100 to transmit the reproduction object sound data, and transmit the acquired music file to the reproduction apparatus 100 using the transmission unit 240.

1-10. Another Example of Management Method of Attribute Information

Figure 10:
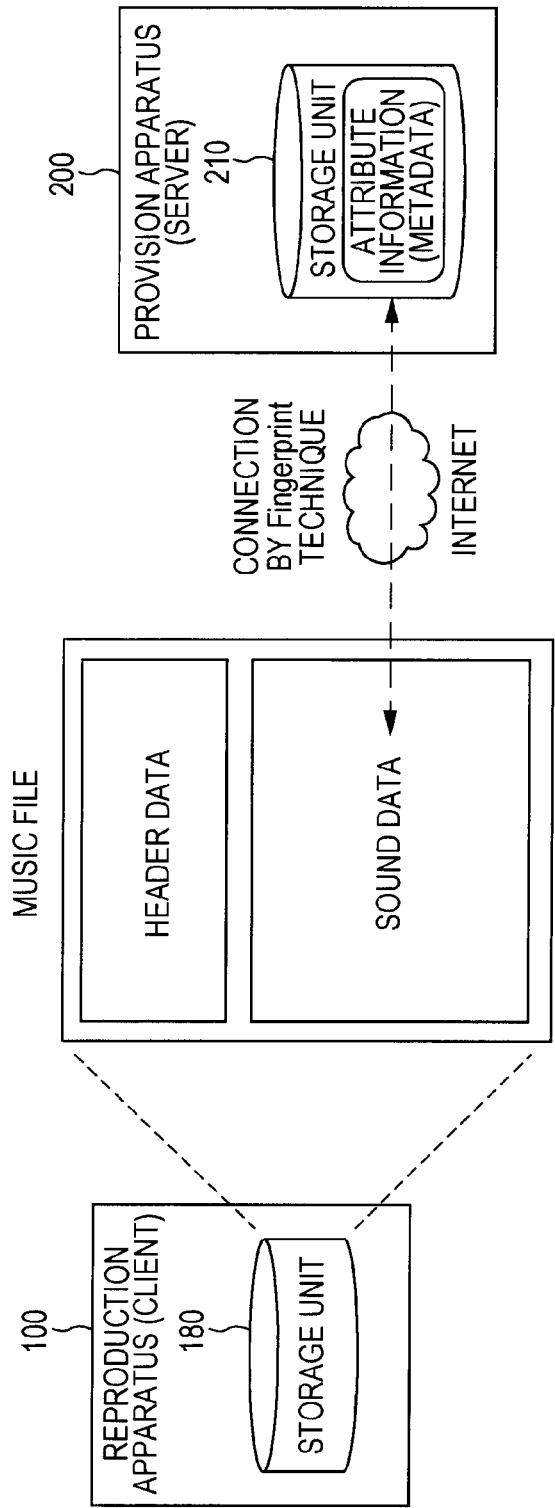
FIG. 10 is a diagram illustrating another example of the management method of attribute information according to the embodiment of the present disclosure.

FIG. 10 is a diagram illustrating another example of the management method of the attribute information according to the embodiment of the present disclosure. Referring to FIG. 10, another example of the management method of the attribute information according to the embodiment of the present disclosure will be described.

As shown in FIG. 10, the attribute information of the reproduction object sound data may not be embedded into the same music file as the reproduction object sound data stored in the storage unit 210 included in the provision apparatus 200. The analysis unit 230 may associate, for example, the analysis result as the attribute information with the reproduction object sound data to be stored in the storage unit 210. The provision apparatus 200 associates, for example, information for identifying the reproduction object sound data with the attribute information to be stored in the storage unit 210.

On the other hand, the reproduction apparatus 100 may transmit a request including the information for identifying the reproduction object sound data to the provision apparatus 200 if necessary, and may acquire the attribute information associated with the information for identifying the reproduction object sound data as a response to the request. As the information for identifying the reproduction object sound data, for example, information (Fingerprint) obtained by analyzing a part of the reproduction object sound data may be used.

1-11. Process Executed by Reproduction System

Figure 11:
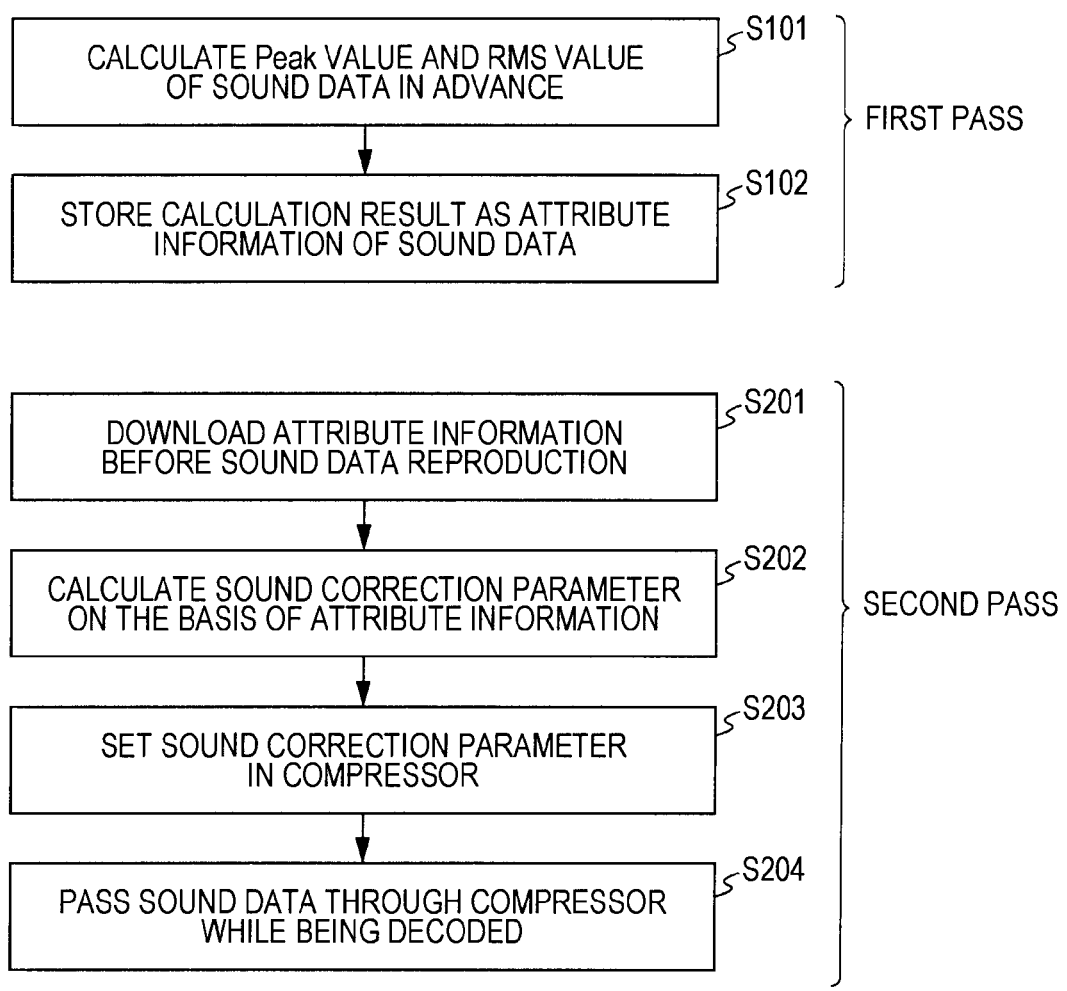
FIG. 11 is a flowchart showing a flow of a process executed by a reproduction system according to the embodiment of the present disclosure.

FIG. 11 is a flowchart showing a flow of a process executed by a reproduction system according to the embodiment of the present disclosure. Referring to FIG. 11, the flow of the process executed by the reproduction system 10 according to the embodiment of the present disclosure will be described.

As shown in FIG. 11, the analysis unit 230 of the provision apparatus 200 may calculate the Peak value and the RMS value of the reproduction object sound data in advance (Step S101). The Peak value and the RMS value of the reproduction object sound data corresponds to the example of the volume characteristic value of the reproduction object sound data. Subsequently, the storage unit 210 may associate the Peak value and the RMS value of the reproduction object sound data calculated by the analysis unit 230 with the reproduction object sound data to be stored as the attribute information (Step S102). For the association between the calculation result and the reproduction object sound data, various methods as described above are considered. Step S101 and Step S102 may be executed as a process of in a first pass in the reproduction system 10. If the storage unit 210 stores the attribute information as such and acquire the attribute information if necessary, there is an advantage in that the process in the first pass may not be performed again when the same reproduction object sound data is reproduced next time and thereafter.

Subsequently, the reception unit 110 of the reproduction apparatus 100 downloads the attribute information of the reproduction object sound data before reproduction of the reproduction object sound data by the image sound data decoding circuit 130 (Step S201). The parameter calculation unit 150 of the reproduction apparatus 100 calculates a volume correction parameter on the basis of the attribute information (Step S202) and sets the calculated volume correction parameter in the compressor circuit 160 (Step S203). The image sound data decoding circuit 130 passes the reproduction object sound data to the compressor circuit 160 while decoding the reproduction object sound data (Step S204). Steps S201 to S204 may be executed as a process in a second pass in the reproduction system 10. When the process in the second pass is executed, the reproduction object sound data after the volume thereof is corrected is output.

1-12. Compressor Circuit That Can Be Applied to Volume Correction of Sound Data

Figure 12:
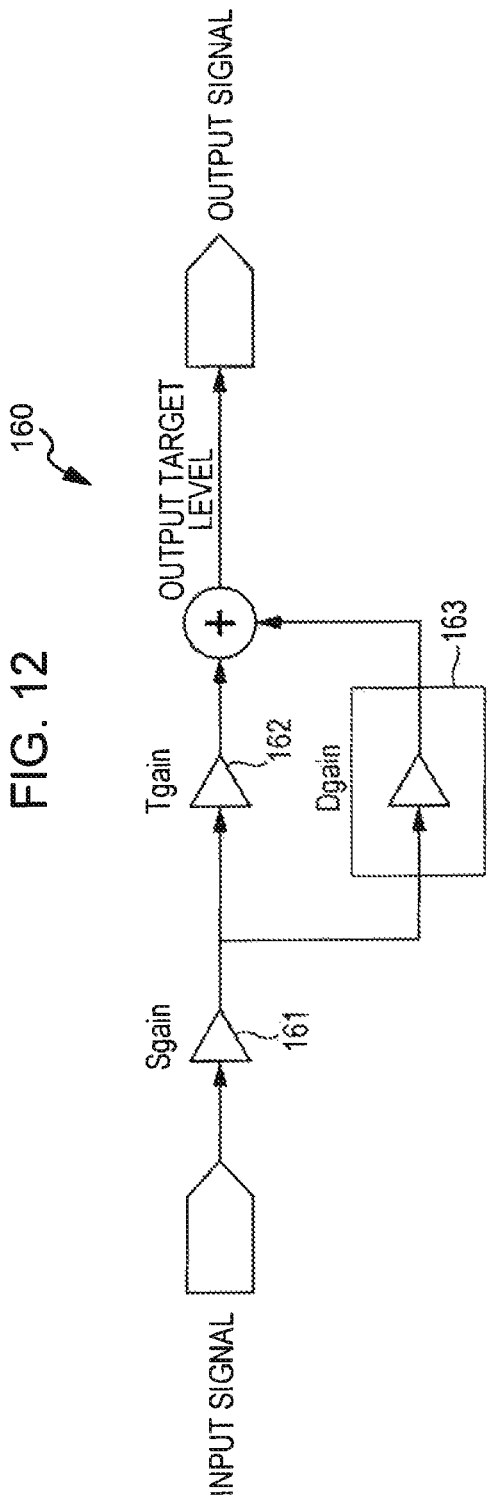
FIG. 12 is a diagram showing a compressor circuit which can be applied to volume correction of sound data by the reproduction apparatus according to the embodiment of the present disclosure.

FIG. 12 is a diagram showing a compressor circuit which can be applied to volume correction of sound data by the reproduction apparatus 100 according to the embodiment of the present disclosure. Referring to FIG. 12, the compressor circuit 160 which can be applied to the volume correction of the sound data by the reproduction apparatus 100 according to the embodiment of the present disclosure will be described.

As shown in FIG. 12, the compressor circuit 160 adjusts a signal so that the strength of the signal input from the image sound data decoding circuit 130 becomes an output target level and outputs the signal after adjustment as an output signal. The compressor circuit 160 according to the embodiment of the present disclosure has, for example, a linear amplification unit 161 and a nonlinear amplification unit 163 unlike an existing compressor circuit. In addition, the compressor circuit 160 has a linear amplification unit 162 connected in parallel to the nonlinear amplification unit 163 at the rear end of the linear amplification unit 161, and including the compressor circuit 160 is one of features of the reproduction apparatus 100 according to the embodiment of the present disclosure. By appropriately controlling amplification units using the metadata, the difference between the volumes of the pieces of sound data is reduced while maintaining the volume change curve by the original sound data intended by a creator, thereby reproducing the sound data while reducing audio deterioration due to the volume amplification. Hereinafter, the signal input to the image sound data decoding circuit 130 is assumed to be an audio signal (for example, an audio signal of the reproduction object sound data) in the description.

The linear amplification unit 161 functions as an example of the first linear correction unit and is denoted by "Sgain" in FIG. 12. In addition, the linear amplification unit 162 functions as an example of the second linear correction unit and is denoted by "Tgain" in FIG. 12. In addition, the nonlinear amplification unit 163 functions as an example of the nonlinear correction unit and is denoted by "Dgain" in FIG. 12. "Sgain", "Tgain", and "Dgain" represent the amplification factors of the respective amplification units.

The linear amplification unit 161 performs a linear amplification process on the audio signal. The linear amplification unit 162 performs a linear amplification unit on the audio signal output from the linear amplification unit 161. The nonlinear amplification unit 163 performs a nonlinear amplification process on the audio signal output from the linear amplification unit 161, and mainly performs an amplitude compression process on an audio waveform with a high audio level. Since the amplitude compression process is performed by the nonlinear process, audio distortion occurs and the amplitude compression rate is increased, so that the distortion rate is increased.

Figure 13:
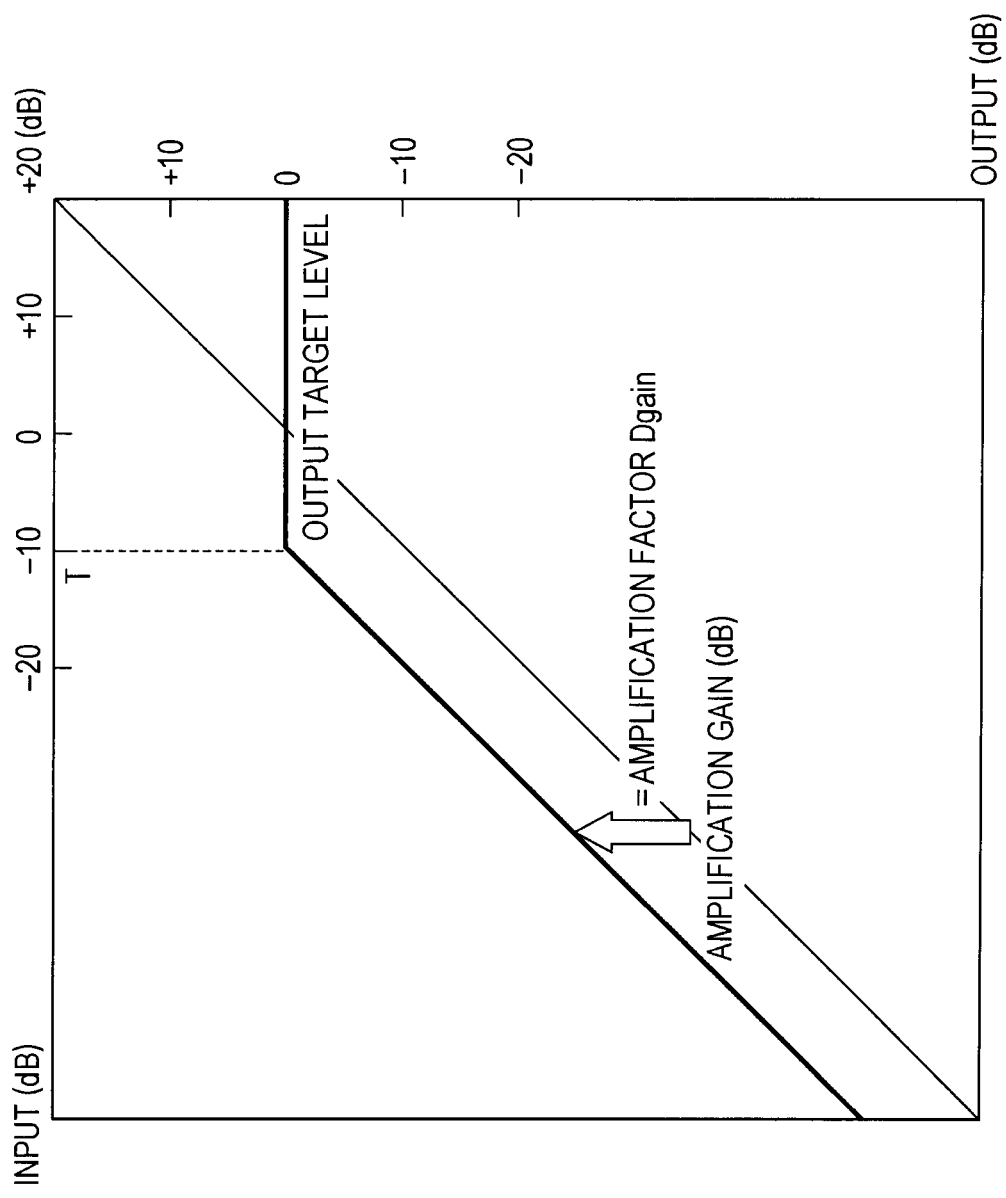
FIG. 13 is a diagram showing an example of static characteristics (in a case of amplifying the volume of the sound data) of the compressor circuit which can be applied to the reproduction apparatus according to the embodiment of the present disclosure.

1-13. Example of Static Characteristics (During Volume Amplification) of Compressor Circuit FIG. 13 is a diagram showing an example of static characteristics (in a case of amplifying the volume of the sound data) of the nonlinear amplification unit 163 in the compressor circuit 160 which can be applied to the reproduction apparatus 100 according to the embodiment of the present disclosure. Referring to FIG. 13, an example of static characteristics (in the case of amplifying the volume of the sound data) of the nonlinear amplification unit 163 in the compressor circuit 160 which can be applied to the reproduction apparatus 100 according to the embodiment of the present disclosure will be described.

The graph shown in FIG. 13 represents the static characteristics of the nonlinear amplification unit 163 (an amplification unit having the amplification factor Dgain) particularly in the case where the volume of the reproduction object sound data is amplified. In FIG. 13, a relationship between the strength of a signal input to the nonlinear amplification unit 163 and the strength of a signal output from the nonlinear amplification unit 163 is shown. In a case of considering dynamic characteristics of the nonlinear amplification unit 163, the strength of the signal output from the nonlinear amplification unit 163 shown in FIG. 13 has a meaning of an output target level controlled by the nonlinear amplification unit 163 to become a signal having the corresponding strength.

In the example shown in FIG. 13, until the strength of the input signal to the nonlinear amplification unit 163 reaches T, an increment of the strength of the output signal from the nonlinear amplification unit 163 is changed in proportion to an increment of the strength of the input signal. In addition, when the strength of the input signal to the nonlinear amplification unit 163 exceeds T, the increment of the strength of the output signal from the nonlinear amplification unit 163 is saturated to 0 dB. Until the strength of the input signal to the nonlinear amplification unit 163 reaches T, the strength of the output signal from the nonlinear amplification unit 163 becomes a value increased by a value obtained by multiplying the strength of the input signal to the nonlinear amplification unit 163 by the amplification factor Dgain. Until the strength of the input signal to the nonlinear amplification unit 163 reaches T, nonlinear amplification is performed on the audio signal.

Figure 14:
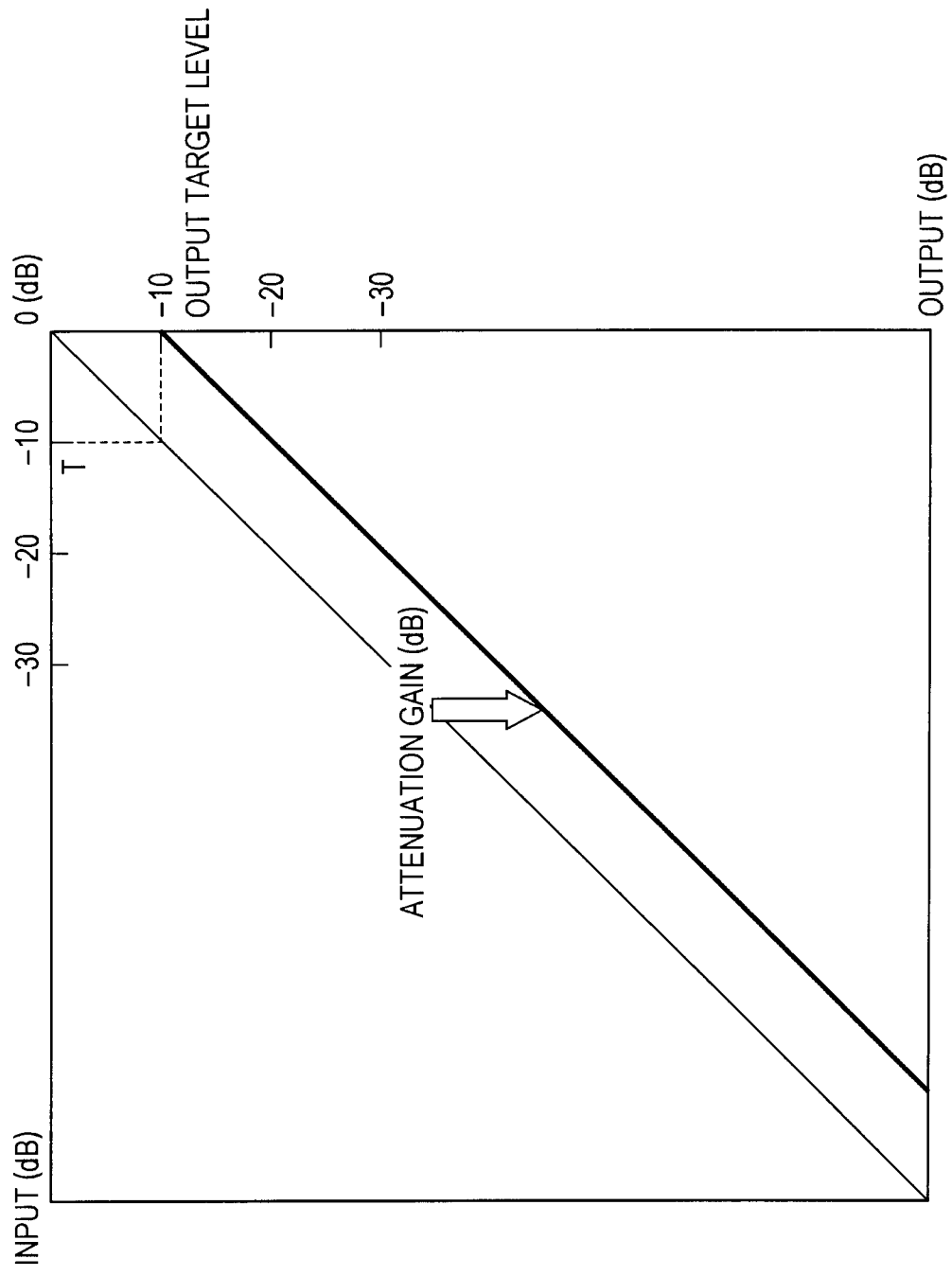
FIG. 14 is a diagram showing an example of static characteristics (in a case of attenuating the volume of the sound data) of the compressor circuit which can be applied to the reproduction apparatus according to the embodiment of the present disclosure.

1-14. Example of Static Characteristics (During Volume Attenuation) of Compressor Circuit FIG. 14 is a diagram showing an example of static characteristics (in a case of attenuating the volume of the sound data) of the nonlinear amplification unit 163 in the compressor circuit 160 which can be applied to the reproduction apparatus 100 according to the embodiment of the present disclosure. Referring to FIG. 14, an example of static characteristics (in the case of attenuating the volume of the sound data) of the nonlinear amplification unit 163 in the compressor circuit 160 which can be applied to the reproduction apparatus 100 according to the embodiment of the present disclosure will be described.

The graph shown in FIG. 14 represents the static characteristics of the nonlinear amplification unit 163 (the amplification unit having the amplification factor Dgain) particularly in the case where the volume of the reproduction object sound data is attenuated. In FIG. 14, the relationship between the strength of the signal input to the nonlinear amplification unit 163 and the strength of the signal output from the nonlinear amplification unit 163 is shown. In the case of considering dynamic characteristics of the nonlinear amplification unit 163, the strength of the signal output from the nonlinear amplification unit 163 shown in FIG. 14 has a meaning of an output target level controlled by the nonlinear amplification unit 163 to become a signal having the corresponding strength.

In the example shown in FIG. 14, the strength of the output signal from the nonlinear amplification unit 163 becomes a value reduced by a value obtained by multiplying the strength of the input signal to the nonlinear amplification unit 163 by the amplification factor Dgain. Until the strength of the input signal to the nonlinear amplification unit 163 reaches T, nonlinear amplification is performed on the audio signal. As in the case shown in FIG. 14, in the case of attenuating the volume of the audio signal, linear attenuation is performed on the audio signal, so that generating audio distortion may not be considered, which is good.

Figure 15:
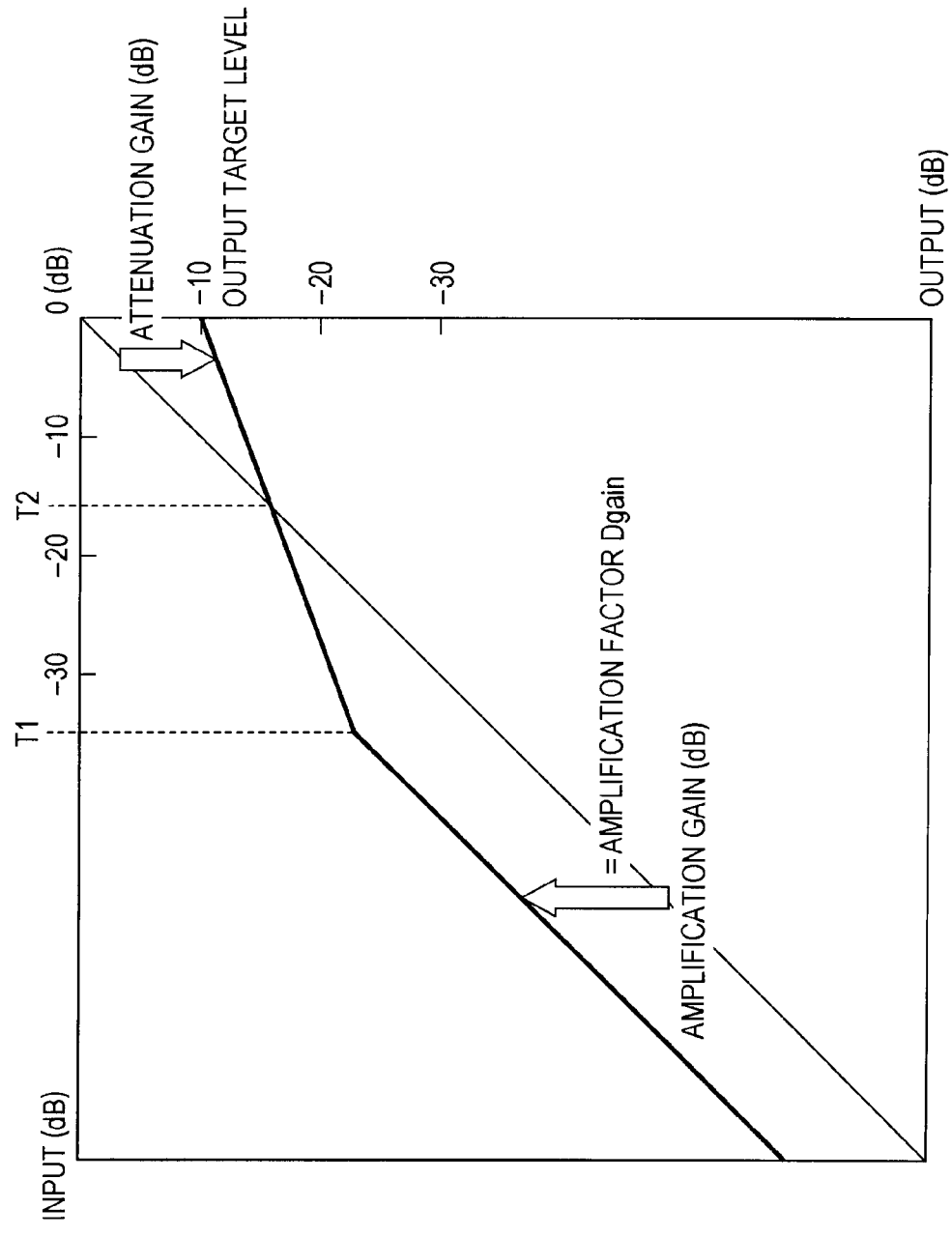
FIG. 15 is a diagram showing another example of static characteristics (in the case of amplifying the volume of the sound data) of the compressor circuit which can be applied to the reproduction apparatus according to the embodiment of the present disclosure.

1-15. Another Example of Static Characteristics (During Volume Amplification) of Compressor Circuit FIG. 15 is a diagram showing another example of static characteristics (in the case of amplifying the volume of the sound data) of the nonlinear amplification unit 163 in the compressor circuit 160 which can be applied to the reproduction apparatus 100 according to the embodiment of the present disclosure. Referring to FIG. 15, another example of static characteristics (in the case of amplifying the volume of the sound data) of the nonlinear amplification unit 163 in the compressor circuit 160 which can be applied to the reproduction apparatus 100 according to the embodiment of the present disclosure will be described.

The graph shown in FIG. 15 represents the static characteristics (the amplification unit having the amplification factor Dgain) of the nonlinear amplification unit 163 particularly in the case where the volume of the reproduction object sound data is amplified, is an example used instead of the static characteristics described with reference to FIG. 13, and corresponds to a combination type of the static characteristics shown in FIG. 13 and the static characteristics shown in FIG. 14. In FIG. 15, the relationship between the strength of the signal input to the nonlinear amplification unit 163 and the strength of the signal output from the nonlinear amplification unit 163 is shown. In the case of considering dynamic characteristics of the nonlinear amplification unit 163, the strength of the signal output from the nonlinear amplification unit 163 shown in FIG. 15 has a meaning of an output target level controlled by the nonlinear amplification unit 163 to become a signal having the corresponding strength.

In the example shown in FIG. 15, until the strength of the input signal to the nonlinear amplification unit 163 reaches T1, the increment of the strength of the output signal from the nonlinear amplification unit 163 is changed in proportion to the increment of the strength of the input signal by a relatively high amplification factor. In addition, when the strength of the input signal to the nonlinear amplification unit 163 exceeds T1, the increment of the strength of the output signal from the nonlinear amplification unit 163 is reduced. After the strength of the input signal to the nonlinear amplification unit 163 exceeds T2, the strength of the output signal from the nonlinear amplification unit 163 becomes lower than the strength of the input signal to the nonlinear amplification unit 163, and nonlinear amplification is performed on the audio signal. The amplification process corresponds to the amplitude compression process, and thus audio distortion may occur.

1-16. Example of Dynamic Characteristics of Compressor Circuit

FIG. 16 is a diagram showing an example of dynamic characteristics of the compressor circuit which can be applied to the reproduction apparatus according to the embodiment of the present disclosure. Referring to FIG. 16, an example of dynamic characteristics of the nonlinear amplification unit 163 in the compressor circuit 160 which can be applied to the reproduction apparatus 100 according to the embodiment of the present disclosure will be described.

In general, a compressor has dynamic characteristics in which an amplification factor is changed with time in order to realize natural audio amplitude compression for the auditory sense. An input signal shown in FIG. 16A corresponds to a tone burst signal. In addition, a signal shown in FIG. 16B corresponds to an envelope signal generated by the compressor. The nonlinear amplification unit 163 in the compressor circuit 160 may generate the envelope signal shown in FIG. 16B on the basis of the input signal shown in FIG. 16A. Generation of the envelope signal will be described later in detail with reference to FIG. 17.

The nonlinear amplification unit 163 obtains an amplification gain from a ratio of the strength of the envelope signal shown in FIG. 16B to the output target level. Specifically, the nonlinear amplification unit 163 divides the output target level by the strength of the envelope signal to be used as the amplification gain. The nonlinear amplification unit 163 multiplies the amplification gain and the input signal shown in FIG. 16A constantly, thereby obtaining an output signal shown in FIG. 16C. The output signal shown in FIG. 16C represents the envelope of the tone burst signal.

1-17. Example of Generation Method of Control Signal in Compressor Circuit

Figure 17:
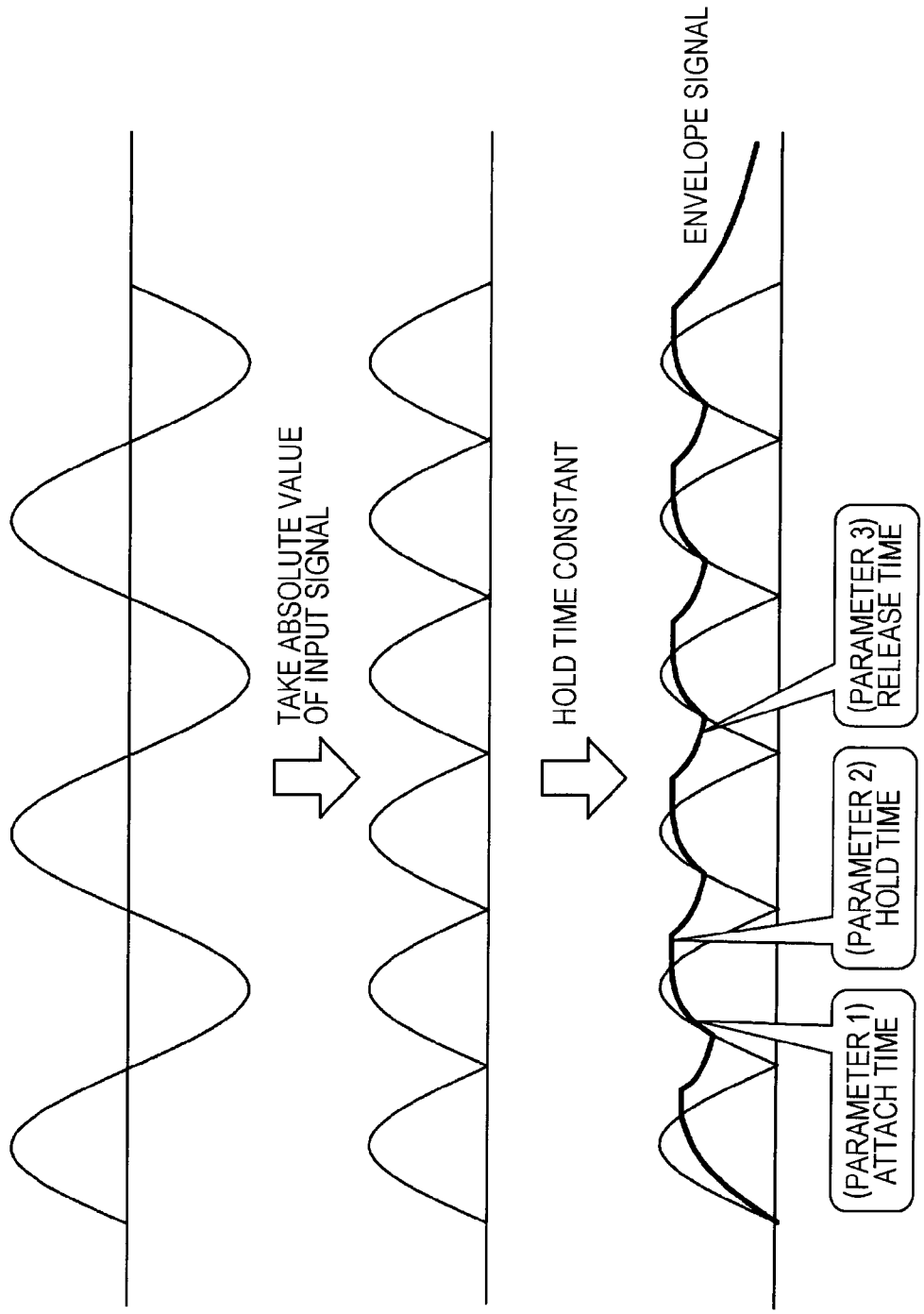
FIG. 17 is a diagram showing an example of a generation method of a control signal (envelope signal) in the compressor circuit which can be applied to the reproduction apparatus according to the embodiment of the present disclosure.

FIG. 17 is a diagram showing an example of a generation method of a control signal (envelope signal) in the nonlinear amplification unit 163 in the compressor circuit 160 which can be applied to the reproduction apparatus 100 according to the embodiment of the present disclosure. Referring to FIG. 17, an example of the generation method of the control signal (the envelope signal) in the compressor circuit 160 which can be applied to the reproduction apparatus 100 according to the embodiment of the present disclosure will be described.

The nonlinear amplification unit 163 takes the absolute value from the input signal shown in FIG. 16A to have a time constant. There are three types of time constant including an attack time representing a rising rate, a hold time to hole a peak, and a release time representing a falling rate. The nonlinear amplification unit 163 can change the behavior of the nonlinear amplification unit 163 in the compressor circuit 160 by changing such parameters. Specifically, as the nonlinear amplification unit 163 changes such parameters, timbre of the audio obtained through the sound data by the compressor circuit 160 is changed. In general, a value appropriate for the auditory sense is set as a fixed value of the parameter.

1-18. Details of Flow of Volume Correction Process of Sound Data

Figure 18:
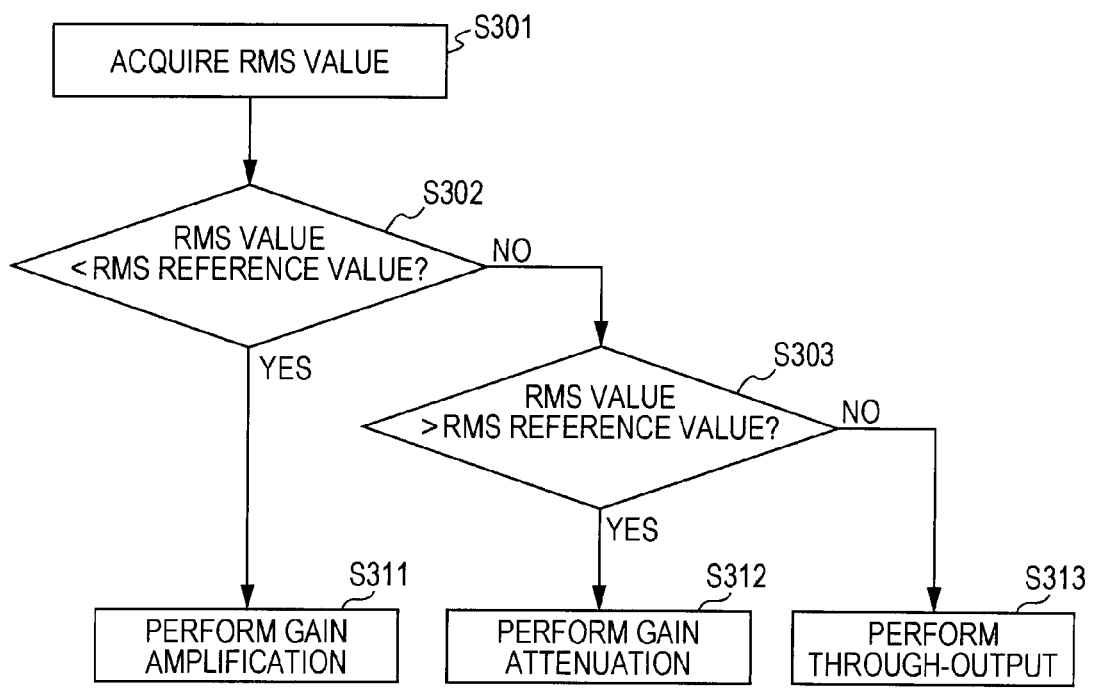
FIG. 18 is a flowchart showing details of the flow of the volume correction process of the sound data by the reproduction apparatus according to the embodiment of the present disclosure.

FIG. 18 is a flowchart showing details of the flow of the volume correction process of the sound data by the reproduction apparatus according to the embodiment of the present disclosure. Referring to FIG. 18, details of the flow of the volume correction process of the sound data by the reproduction apparatus 100 according to the embodiment of the present will be described. Moreover, the process shown in FIG. 18 corresponds to the process in the above-described second pass.

As shown in FIG. 18, the attribute information acquisition unit 140 of the reproduction apparatus 100 acquires the RMS value of the reproduction object sound data via the reception unit 110 (Step S301). The parameter calculation unit 150 compares the RMS value acquired by the attribute information acquisition unit 140 and an RMS reference value determined in advance (Step S302). The RMS reference value is determined on the basis of the distribution of the RMS values of the plurality of pieces of sound data, and a determination method thereof will be described later in detail.

In a case where the RMS value is lower than the reference value, the parameter calculation unit 150 calculates a parameter for performing volume amplification (gain amplification) S311, and in a case where the RMS value is higher than the reference value S303, calculates a parameter for performing volume attenuation (gain attenuation) S312. In a case where the RMS value is equal to the reference value, a parameter for not performing volume correction (performing through-output) S313 is calculated. The parameter calculation unit 150 may calculate, for example, a parameter for linear correction set in the linear amplification unit 161 in the compressor circuit 160 (for example, the amplification factor Sgain) and a parameter for nonlinear correction set in the nonlinear amplification unit 163 in the compressor circuit 160 (for example, the amplification factor Dgain). The compressor circuit 160 performs volume correction on the basis of the parameters calculated by the parameter calculation unit 150.

Figure 19:
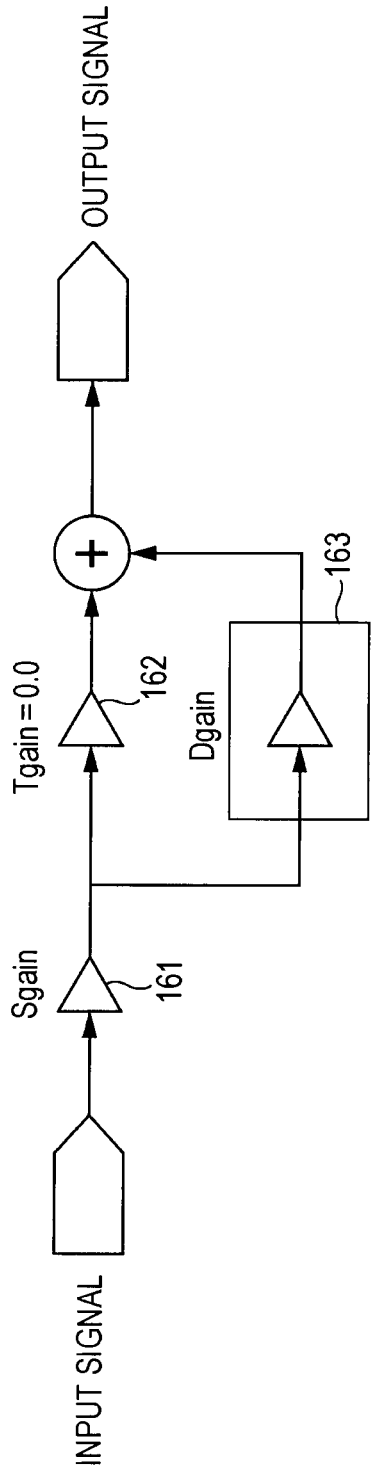
FIG. 19 is a diagram showing a calculation example of a parameter (in the case of amplifying the volume of the sound data) by a parameter calculation unit which can be applied to the reproduction apparatus according to the embodiment of the present disclosure.

1-19. Calculation Example of Parameter (During Volume Amplification) by Parameter Calculation Unit FIG. 19 is a diagram showing a calculation example of a parameter (in the case of amplifying the volume of the sound data) by the parameter calculation unit 150 which can be applied to the reproduction apparatus 100 according to the embodiment of the present disclosure. Referring to FIG. 19, a calculation example of a parameter (in the case of amplifying the volume of the sound data) by the parameter calculation unit 150 which can be applied to the reproduction apparatus 100 according to the embodiment of the present disclosure will be described.

As shown in FIG. 19, in the case of amplifying the volume of the sound data, the parameter calculation unit 150 calculates the amplification factor Sgain set in the linear amplification unit 161 (an example of the parameter for linear correction) and the amplification factor Dgain set in the nonlinear amplification unit 163 (an example of the parameter for nonlinear correction) so that the entire volume of the reproduction object sound data is amplified (RMS reference value/RMS value) times.

First, a calculation method of the amplification factor Sgain set in the linear amplification unit 161 will be described. Here, the Peak value which is one of the metadata of the reproduction object sound data is used. The parameter calculation unit 150 calculates, for example, a ratio of the Peak value which is one of the metadata to the volume upper limit (for example, "32768") as the amplification factor Sgain set in the linear amplification unit 161. The amplification factor Sgain calculated by the parameter calculation unit 150 is set in the linear amplification unit 161 by the parameter calculation unit 150. Since the linear amplification unit 161 performs linear amplification in consideration of the Peak value which is one of the metadata, It is guaranteed that the amplification is not saturated. Therefore, during the volume amplification in the linear amplification unit 161, audio distortion does not occur. Here, there is a possibility of the volume amplification in the linear amplification unit 161 being insufficient, so that an insufficient part of the volume amplification may be supplemented by the nonlinear amplification unit 163.

Next, the calculation method of the amplification factor Dgain set by the nonlinear amplification unit 163 will be described. Here, the RMS value which is one of the metadata of the reproduction object sound data is used. The parameter calculation unit 150 calculates the amplification factor Dgain on the basis of the ratio of the RMS value of the reproduction object sound data to the RMS reference value. The amplification factor Dgain calculated by the parameter calculation unit 150 is set in the nonlinear amplification unit 163 by the parameter calculation unit 150. The parameter calculation unit 150 calculates, for example, (RMS reference value/RMS value)/Sgain as the amplification factor Dgain. When the value is set as the amplification factor Dgain by the parameter calculation unit 150, the amplification in the nonlinear amplification unit 163 is suppressed to a low level in consideration of the amplification factor Sgain. That is, audio distortion can be suppressed to a low level. The amplification factor Dgain corresponds to the amplification factor of the static characteristics shown in FIG. 13.

Figure 20:
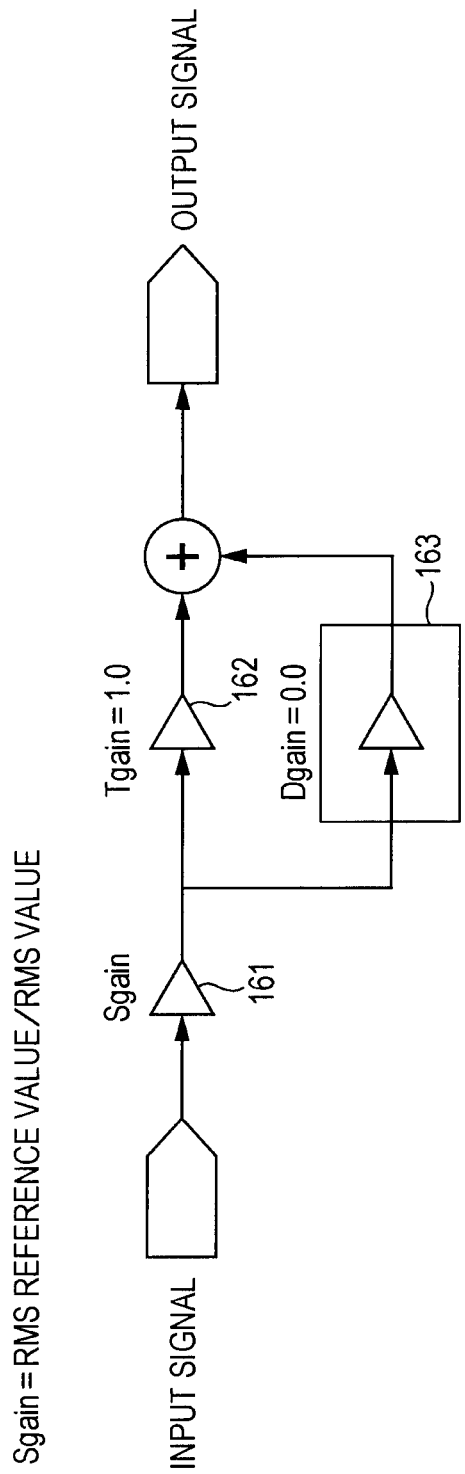
FIG. 20 is a diagram showing a calculation example of a parameter (in the case of attenuating the volume of the sound data) by the parameter calculation unit which can be applied to the reproduction apparatus according to the embodiment of the present disclosure.

1-20. Calculation Example of Parameter (During Volume Attenuation) by Parameter Calculation Unit FIG. 20 is a diagram showing a calculation example of a parameter (in the case of attenuating the volume of the sound data) by the parameter calculation unit 150 which can be applied to the reproduction apparatus 100 according to the embodiment of the present disclosure. Referring to FIG. 20, a calculation example of a parameter (in the case of attenuating the volume of the sound data) by the parameter calculation unit 150 which can be applied to the reproduction apparatus 100 according to the embodiment of the present disclosure will be described.

As shown in FIG. 20, in the case of attenuating the volume of the sound data, the parameter calculation unit 150 calculates the ratio of the RMS reference value to the RMS value of the reproduction object sound data as the amplification Sgain set in the linear amplification unit 161 (an example of the parameter for linear correction). The amplification factor Sgain calculated by the parameter calculation unit 150 is set in the linear amplification unit 161 by the parameter calculation unit 150.

The parameter calculation unit 150 calculates "0.0" as the amplification factor Dgain (an example of the parameter for nonlinear correction). "1.0" is calculated as the amplification factor Tgain. The amplification factor Dgain and the amplification factor Tgain calculated by the parameter calculation unit 150 are respectively set in the nonlinear amplification unit 163 and the linear amplification unit 162 by the parameter calculation unit 150. When the values are set by the parameter calculation unit 150, since linear attenuation is performed by the linear amplification unit 162, attenuation can be achieved without audio distortion. The linear amplification unit 162 performs through-output, and the nonlinear amplification unit 163 outputs silence, so that outputs from both the linear amplification unit 162 and the nonlinear amplification unit 163 are added to become an output signal at the final end.

Figure 21:
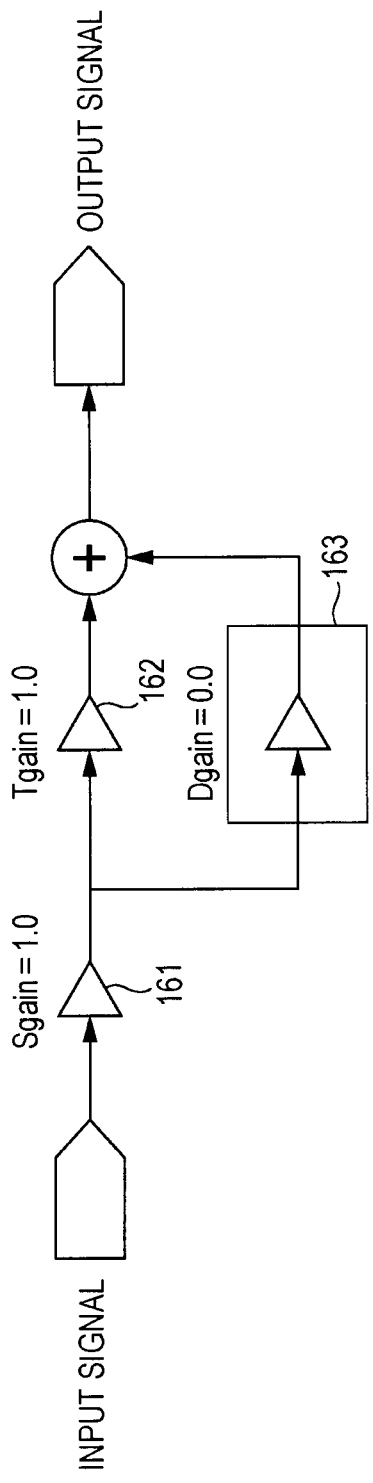
FIG. 21 is a diagram showing a calculation example of a parameter (in the case of subjecting the sound data to through-output) by the parameter calculation unit which can be applied to the reproduction apparatus according to the embodiment of the present disclosure.

1-21. Calculation Example of Parameter (During Through-Output) by Parameter Calculation Unit FIG. 21 is a diagram showing a calculation example of a parameter (in the case of subjecting the sound data to through-output) by the parameter calculation unit 150 which can be applied to the reproduction apparatus 100 according to the embodiment of the present disclosure. Referring to FIG. 21, a calculation example of the parameter (in the case of subjecting the sound data to through-output) by the parameter calculation unit 150 which can be applied to the reproduction apparatus 100 according to the embodiment of the present disclosure will be described.

As shown in FIG. 21, in the case where the sound data is subjected to through-output, the parameter calculation unit 150 calculates "1.0" as the amplification factor Sgain set in the linear amplification unit 161 (an example of the parameter for linear correction). In addition, the parameter calculation unit 150 calculates "0.0" as the amplification factor Dgain (an example of the parameter for nonlinear correction). In addition, the parameter calculation unit 150 calculates "1.0" as the amplification factor Tgain.

The amplification factor Sgain, the amplification factor Dgain, and the amplification factor Tgain calculated by the parameter calculation unit 150 are respectively set in the linear amplification unit 161, the nonlinear amplification unit 163, and the linear amplification unit 162 by the parameter calculation unit 150. When the values are set by the parameter calculation unit 150, the process by the nonlinear amplification unit 163 is not performed, so that audio without distortion can be output.

Next, a method of obtaining the RMS reference value used for the calculating in the parameter calculation unit 150 will be described. The RMS reference value is calculated from, for example, the statistical distributions of the Peak value and the RMS value of the reproduction object sound data.

Figure 22:
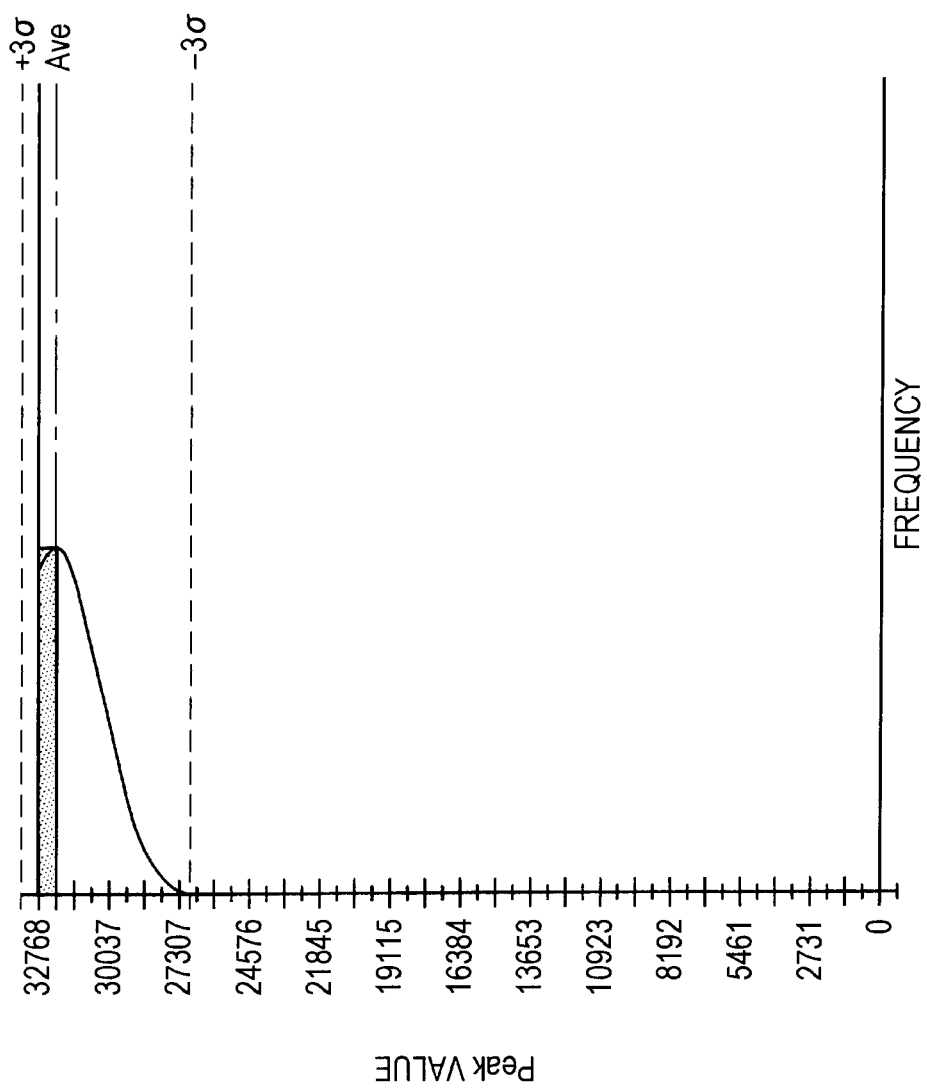
FIG. 22 is a diagram illustrating a statistical distribution of Peak values as an example of a volume characteristic value according to the embodiment of the present disclosure.

1-22. Statistical Distribution of Peak Value as Example of Volume Characteristic Value FIG. 22 is a diagram illustrating a statistical distribution of Peak values as an example of the volume characteristic value according to the embodiment of the present disclosure. Referring to FIG. 22, a statistical distribution of the Peak values as an example of the volume characteristic value according to the embodiment of the present disclosure will be described.

FIG. 22 shows the statistical distribution (histogram) of the Peak values of a group of ordinary music tracks (an example of sound data). The Peak value of many music tracks is about 32768 which is the upper limit of the volume. However, referring to the histogram shown in FIG. 22, there are many music tracks in which the Peak value is not in the vicinity of the upper limit of the volume. Therefore, to the music tracks, a combination of amplification factors for the linear amplification as shown in FIG. 19 is applied, thereby appropriately suppressing audio distortion due to the nonlinear amplification. In this example, the statistical distribution of the Peak values is not directly used for calculating the RMS reference value. However, the statistic characteristics and dynamic characteristics of the nonlinear amplification unit 163 may be changed to achieve the optimal amplification factor from the difference between the average value of the statistical distribution of the Peak values and the average value of the statistical distribution of the RMS values described later.

Figure 23:
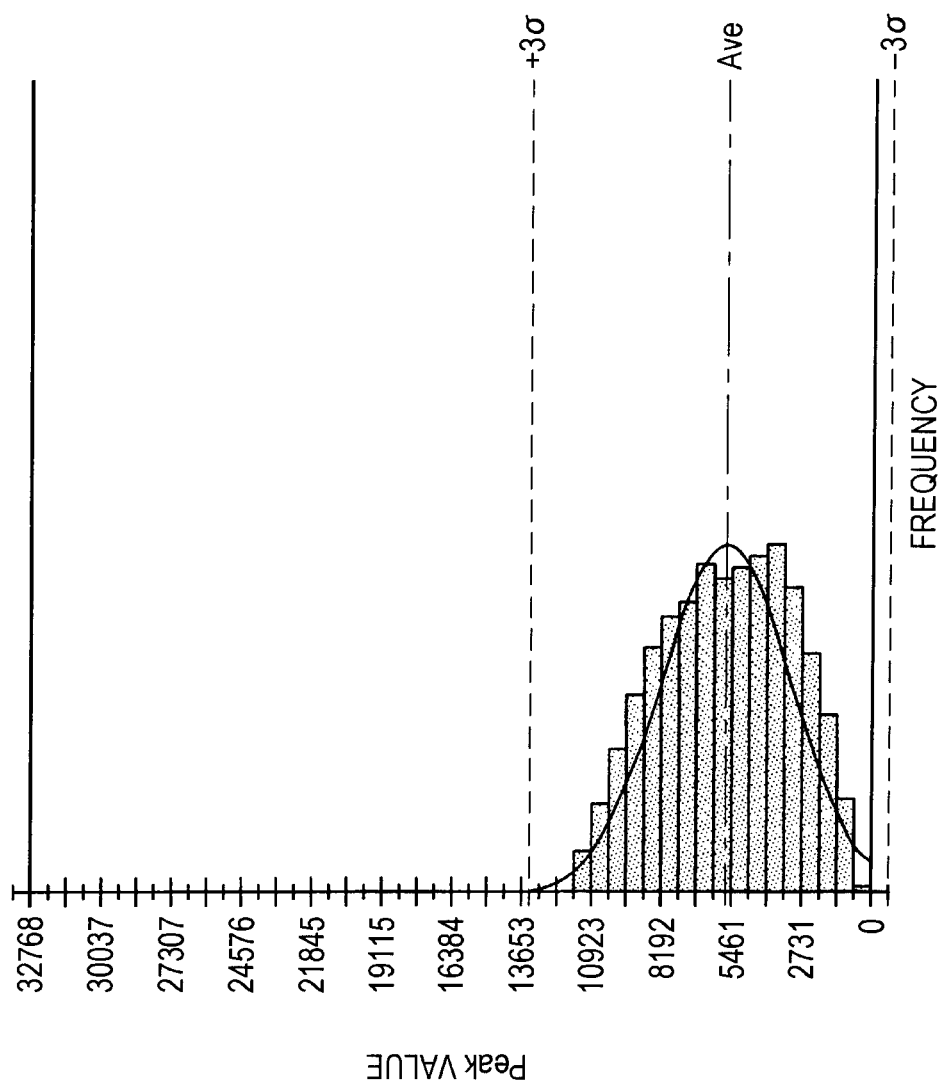

1-23. Statistical Distribution of RMS Value as Example of Volume Characteristic Value FIG. 23 is a diagram illustrating a statistical distribution of RMS values as an example of the volume characteristic value according to the embodiment of the present disclosure. Referring to FIG. 23, a statistical distribution of the RMS values as an example of the volume characteristic value according to the embodiment of the present disclosure will be described.

FIG. 23 shows the statistical distribution (histogram) of the RMS values of a group of ordinary music tracks (an example of sound data). Referring to FIG. 23, it can be seen that the RMS values are distributed over a wide range in a substantially normal distribution with respect to the average value of the RMS values. It can be seen that various music tracks are distributed with a volume difference of tens of dB. Since a music library corresponding to the group of music tracks that a listener is to reproduce exists in advance, it is possible to obtain the statistical distribution of the group of music tracks in advance. This is also applied to a use case of streaming reproduction via a network. In the embodiment of the present disclosure, the statistical distribution of the group of music tracks to be reproduced may be calculated and obtained in advance as shown in FIGS. 22 and 23 and the like.

1-24. Example of Determination Method of RMS Reference Value

Figure 24:
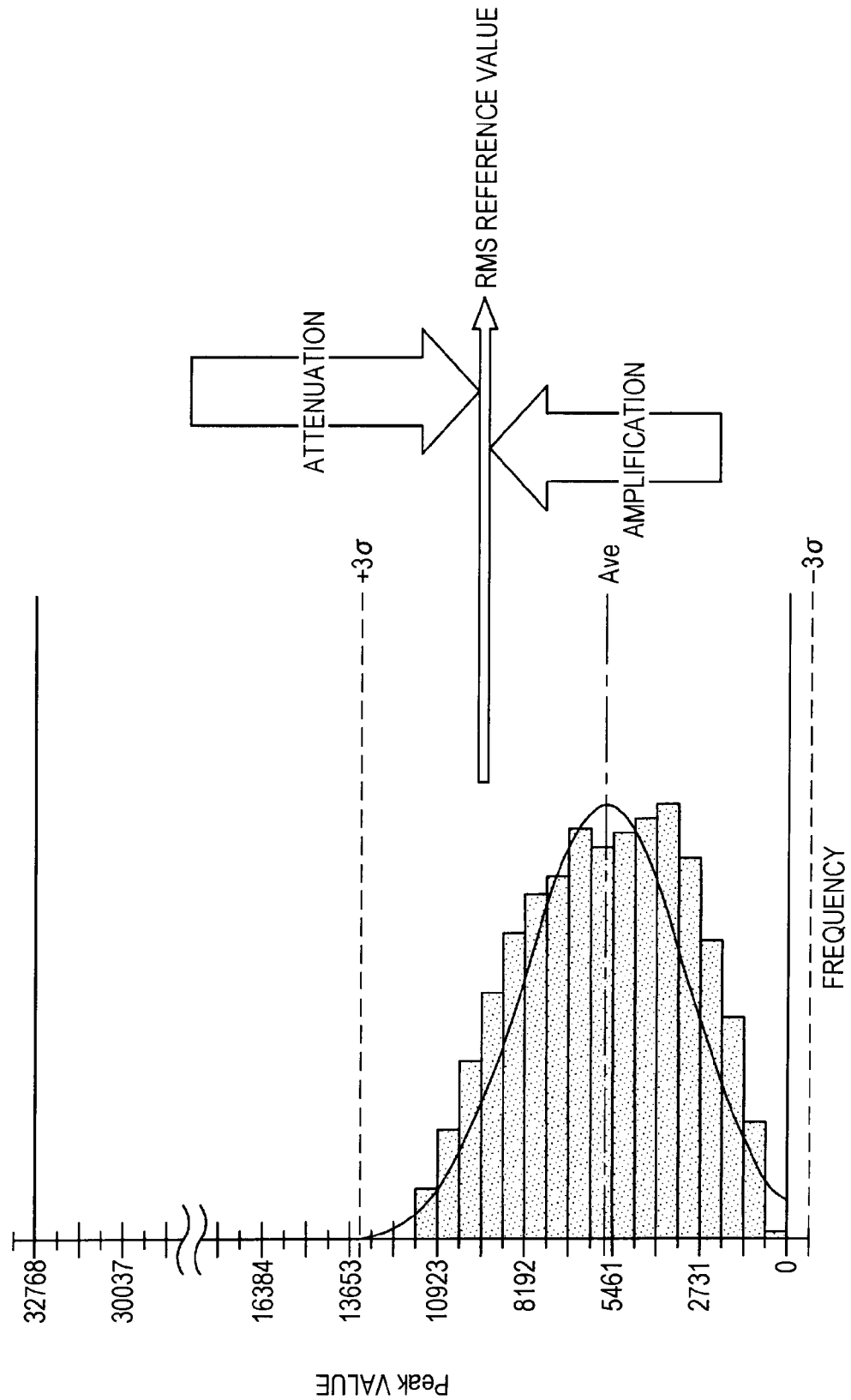
FIG. 24 is a diagram illustrating an example of a determination method of an RMS reference value which can be used for the volume correction process of the sound data by the reproduction apparatus according to the embodiment of the present disclosure.

FIG. 24 is a diagram illustrating an example of a determination method of an RMS reference value which can be used for the volume correction process of the sound data by the reproduction apparatus 100 according to the embodiment of the present disclosure. Referring to FIG. 24, an example of the determination method of the RMS reference value which can be used for the volume correction process of the sound data by the reproduction apparatus 100 according to the embodiment of the present disclosure will be described.

As shown in FIG. 24, the analysis unit 230 can obtain the average value of the RMS values from the statistical distribution. The analysis unit 230 may use the average value of the RMS values as the RMS reference value. However, in the example shown in FIG. 24, the analysis unit 230 may use, as the RMS reference value, the average value of the RMS values+1.5 sigma (sigma is a standard deviation). In addition, the analysis unit 230 may use, as the RMS reference value, the average value of the RMS values+3 sigma-several dB (for example, 6 dB). A reason that the analysis unit 230 does not use the average value of the RMS values as the RMS reference value is to operate volume correction of a more number of music tracks in a gain amplification mode, and good sound is made with an S/N that effectively uses a quantization bit rate of 16 bits.

Which of thee operation modes (gain amplification, gain attenuation, and through-output) is preferable to operate the normalizer depends on the preference of a user, so that the determination method of the RMS reference value is not typically determined, and the user may determine a preferable volume level on the basis of the RMS average value of the statistical distribution.

1-25. Another Example of Determination Method of RMS Reference Value

Figure 25:
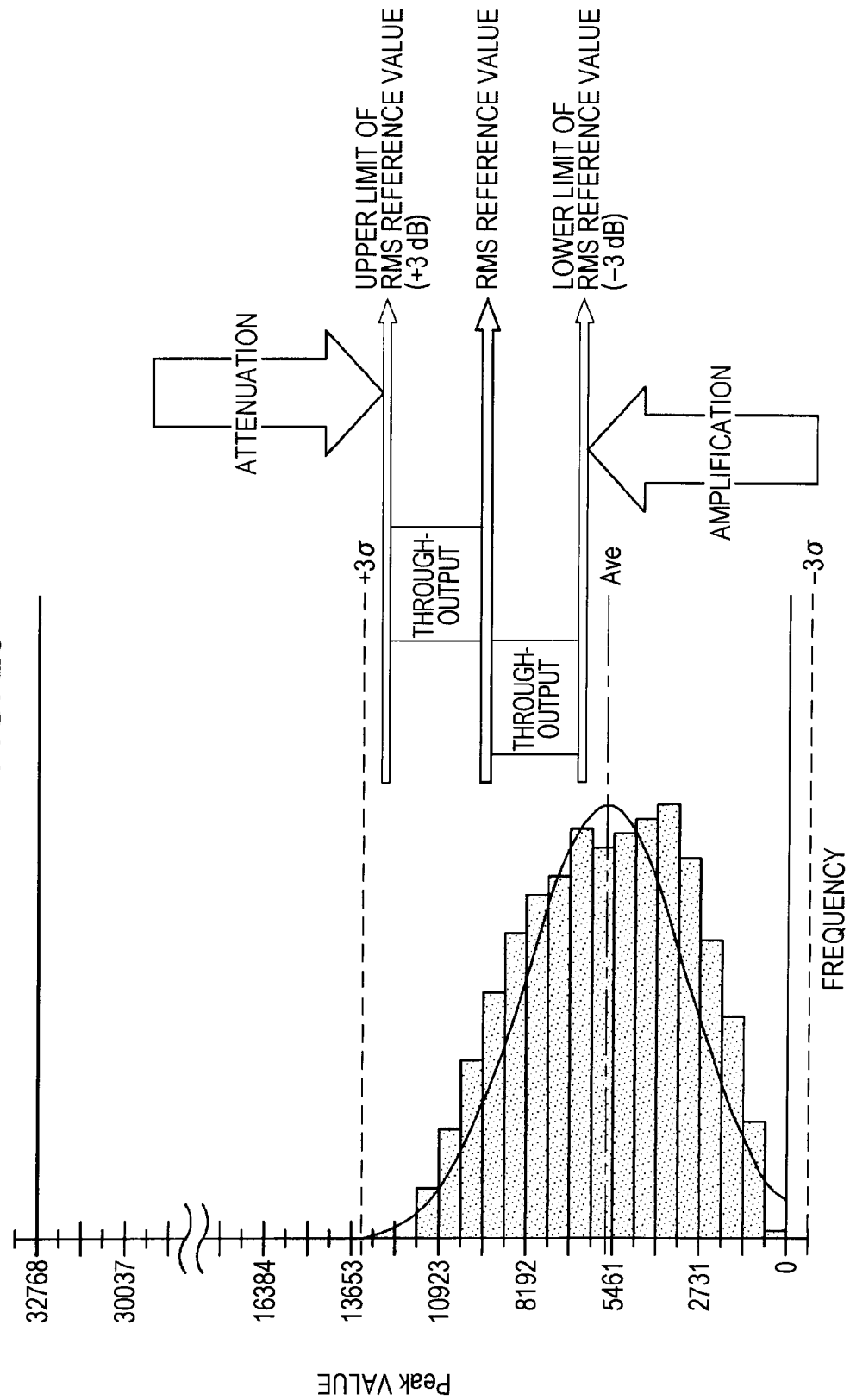
FIG. 25 is a diagram illustrating another example of the determination method of the RMS reference value which can be used for the volume correction process of the sound data by the reproduction apparatus according to the embodiment of the present disclosure.

FIG. 25 is a diagram illustrating another example of the determination method of the RMS reference value which can be used for the volume correction process of the sound data by the reproduction apparatus 100 according to the embodiment of the present disclosure. Referring to FIG. 25, another example of the determination method of the RMS reference value which can be used for the volume correction process of the sound data by the reproduction apparatus 100 according to the embodiment of the present disclosure will be described.

In the example shown in FIG. 24, a single RMS reference value is used. However, in the example shown in FIG. 25, an upper limit and a lower limit of the RMS reference value, a total of 2 values are provided. Here, the parameter calculation unit 150 calculates a parameter for amplifying the volume of the reproduction object sound data in a case where the RMS value of the reproduction object sound data is lower than a lower reference value (lower limit of the RMS reference value) which is lower than the RMS reference value. In addition, the parameter calculation unit 150 calculates a parameter for attenuating the volume of the reproduction object sound data in a case where the RMS value of the reproduction object sound data is higher than an upper reference value (upper limit of the RMS reference value) which is higher than the RMS reference value. The parameter calculation unit 150 calculates a parameter for subjecting the reproduction object sound data to through-output in a case where the RMS value of the reproduction object sound data is included between the lower limit of the RMS reference value and the upper limit of the RMS reference value.

A difference between the RMS reference value and the lower reference value and a difference between the RMS reference value and the upper reference value are not particularly limited and may be, for example, 3 dB. That is, the RMS reference value+3 dB may be used as the upper limit of the RMS reference value, and a level of the RMS reference value−3 dB may be used as the lower limit of the RMS reference value. The compressor circuit 160 may perform a volume correction operation for gain attenuation on a music track having an RMS value higher than the upper limit of the RMS reference value, and perform a volume correction operation for gain amplification on a music track having an RMS value lower than the lower limit of the RMS reference value. No operation is performed on a music track having an RMS value between the upper limit of the RMS reference value and the lower limit of the RMS reference value, and the music track is subjected to though-output. By subjecting the music track to through-output, volume control processes which are unnecessary for the reproduction object sound data may not be performed, so that deterioration of sound quality can be minimized. Setting of the operation modes can be freely determined by the user side on the basis of the RMS average value of the statistical distribution.

2. Usage Example

A usage example of the reproduction system 10 according to the embodiment of the present disclosure described above and a usage example of an ordinary reproduction system will be described. As described as follow, scenarios 1 and 2 are described as the usage example of the ordinary reproduction system, and a scenario 3 is described as the usage example of the reproduction system 10 according to the embodiment of the present disclosure.

SCENARIO EXAMPLE 1

Mr. A has 100 CDs purchased until now, and all music tracks were ripped by a PC or the like to be stored. About 1000 music tracks as the number of music tracks were stored in the PC. From the tracks, classical music tracks and rock music tracks were mixed. Mr. A reproduced music files on the PC in random order using dedicated software.

Rock music was reproduced as the first music track. Since the volume was high, the volume was set to 3rd of 10 stages. Classical music was reproduced as the second music track. Due to feeling that the volume was very low, Mr. A increased the volume from 3 to 7. However, this classical music track built and Mr. A felt that the music was loud.

There, Mr. A reduced the volume to 5. Another rock music track was reproduced as the third music track and thus Mr. A felt that the volume was very high, Mr. A reduces the volume from 5 to 3. Mr. A felt that volume adjustment was very cumbersome.

SCENARIO EXAMPLE 2

Mr. A turned on an existing "dynamic" normalizer process. Mr. A reproduced music files on the PC in random order using dedicated software. Rock music was reproduced as the first music track. Since the volume was high, the volume was set to the 3rd of 10 stages. Classical music was reproduced as the second music track. Since it did not feel that the volume thereof was different from the rock music, this classical music track was reproduced while the volume was set to 3. However, Mr. A felt that sound of the flute or the piano in the classical music track was distorted compared to that of the original music track.

In addition, this classical music track is a music track in which the former part was quiet and the latter part greatly built. However, Mr. A felt that the volume of the flute and the piano was greatly increased from the former part. Since the building part in the latter part was started with the force of a feeling of the volume of the former part, a dramatic building part in the latter part was not sensed. Another rock music track was reproduced as the third music track. Although the volume was not changed but maintained at 3 throughout the volume adjustment, Mr. A felt that the volume of the classical music track was unnatural and sound quality was deteriorated due to distortion.

SCENARIO EXAMPLE 3

Mr. A turned on the volume correction function of the reproduction system 10 according to the embodiment of the present disclosure. Mr. A reproduced music files on the PC in random order using dedicated software. Rock music was reproduced as the first music track. Since the volume was high, the volume was set to 3rd of 10 stages. Classical music was reproduced as the second music track. Although the classical music track started with a quiet feeling from the playing of a flute and the piano, the volume was a high enough level to be increased. Rather, the playing of the flute and the piano was musical in the stillness. The sound was heard with a transparent and beautiful timbre. In the latter part, the playing of an orchestra with a large number of players including percussion instruments was started, and Mr. A felt that great build was sensed. Even in this case, a feeling of the optimal volume was sensed while the volume was maintained at 3.

The reproduction of the classical music track was ended, and another rock music track was reproduced as the third music track. Although a pleasant drum and guitar sound in rock melodies was reproduced after the classical music track, the feeling of the volume was good. The volume was not changed while being maintained at the level 3 throughout the volume adjustment. Throughout the reproduction, a contrast between the elegant timbre of the classic music and the wild timbre of the rock music was pleasant. The feeling of the volume was good at 3 throughout the reproduction.

3. Modified Example

While exemplary embodiments of the present disclosure have been described in detail with reference to the accompanying drawings, the present disclosure is not limited to the embodiments. It should be understood by those skilled in the art that various modifications, combinations, sub-combinations and alterations may occur depending on design requirements and other factors insofar as they are within the scope of the appended claims or the equivalents thereof.

For example, in the embodiments, the statistical process for calculating the RMS reference value is performed on the music tracks stored by the provision apparatus 200; however, the present disclosure is not limited to the example. For example, the RMS reference value may be determined according to the genre of each music track. For example, the RMS reference value of a group of classical music tracks and the RMS reference value of a group of rock music tracks are separately calculated for use in the volume correction by the reproduction apparatus 100. In addition, the RMS reference value may also be calculated for each play list of the user. In addition, in the embodiment, the statistical process for calculating the RMS reference value is performed by the provision apparatus 200; however, the statistical process may also be performed by the reproduction apparatus 100.

4. Conclusions

According to the embodiment, it is possible to reduce the difference between the volumes of pieces of sound data while maintaining a change in volume which is relatively close to a change in the volume of original sound data, thereby reproducing the sound data while reducing audio distortion due to volume amplification.

The present disclosure contains subject matter related to that disclosed in Japanese Priority Patent Application JP 2010-250714 filed in the Japan Patent Office on Nov. 9, 2010, the entire contents of which are hereby incorporated by reference.

What is claimed is:

1. A reproduction apparatus comprising:
a reproduction unit which reproduces sound data;
a volume correction unit which corrects a volume of the sound data reproduced by the reproduction unit on the basis of relationships between a volume characteristic value of the sound data and volume characteristic values of a plurality of pieces of sound data; and
a parameter calculation unit which calculates a parameter for volume correction on the basis of the relationships between the volume characteristic value of the sound data and the volume characteristic values of the plurality of pieces of sound data, wherein the volume correction unit corrects the volume of the sound data according to the parameter calculated by the parameter calculation unit, wherein the volume characteristic value represents a volume average value of the sound data, wherein the parameter calculation unit calculates a parameter for amplifying the volume of the sound data in a case where the volume average value of the sound data is lower than a reference average value determined on the basis of a distribution of the volume average value of the plurality of pieces of sound data, wherein the parameter calculation unit calculates a parameter for attenuating the volume of the sound data in a case where the volume average value of the sound data is higher than the reference average value, and wherein the reproduction unit, the volume correction unit, and the parameter calculation unit are each implemented via at least one processor.

2. The reproduction apparatus according to claim 1, wherein the volume correction unit has a nonlinear correction unit and a first linear correction unit, and the parameter calculation unit calculates a parameter for linear correction set by the first linear correction unit, and a parameter for nonlinear correction set by the nonlinear correction unit, and wherein the nonlinear correction unit and the first linear correction unit are each implemented via at least one processor.

3. The reproduction apparatus according to claim 2, wherein the parameter calculation unit calculates a ratio of a volume upper limit to a volume peak value of the sound data as the parameter for linear correction in the case where the volume average value of the sound data is lower than the reference average value, and calculates the parameter for nonlinear correction on the basis of a ratio of the reference average value to the volume average value of the sound data.

4. The reproduction apparatus according to claim 3, wherein the parameter calculation unit calculates the ratio of the reference average value to the volume average value of the sound data as the parameter for linear correction in the case where the volume average value of the sound data is higher than the reference average value.

5. The reproduction apparatus according to claim 4, wherein the parameter calculation unit calculates the parameter for amplifying the volume of the sound data in a case where the volume average value of the sound data is lower than a lower reference value that is lower than the reference average value, the parameter calculation unit calculates the parameter for attenuating the volume of the sound data in a case where the volume average value of the sound data is higher than an upper reference value that is higher than the reference average value, and the parameter calculation unit sets a parameter for subjecting the sound data to through-output in a case where the volume average value of the sound data is included between the lower reference value and the upper reference value.

6. The reproduction apparatus according to claim 5, wherein the volume correction unit has a second linear correction unit connected in parallel to the nonlinear correction unit at a rear end of the first linear correction unit and the parameter calculation unit sets the parameter for subjecting the sound data to through-output to an amplification factor of 1 in the first and second linear correction units, and sets the parameter for nonlinear correction to an amplification factor of 0, and wherein the second linear correction unit is implemented via at least one processor.

7. A reproduction method comprising:
reproducing sound data;
correcting a volume of the reproduced sound data on the basis of relationships between a volume characteristic value of the sound data and volume characteristic values of a plurality of pieces of sound data;
calculating a parameter for volume correction on the basis of the relationships between the volume characteristic value of the sound data and the volume characteristic values of the plurality of pieces of sound data, wherein the volume of the reproduced sound data is corrected according to the calculated parameter, wherein the volume characteristic value represents a volume average value of the sound data, wherein a parameter for amplifying the volume of the sound data is calculated in a case where the volume average value of the sound data is lower than a reference average value determined on the basis of a distribution of the volume average value of the plurality of pieces of sound data, and wherein a parameter for attenuating the volume of the sound data is calculated in a case where the volume average value of the sound data is higher than the reference average value.

8. A provision apparatus comprising:
a storage unit which stores sound data and a volume characteristic value of each of a plurality of pieces of sound data;
an acquisition unit which acquires the sound data and the volume characteristic value of each of the plurality of pieces of sound data;
an analysis unit which analyzes the sound data and analyzes a distribution of the volume characteristic values of the plurality of pieces of sound data; and
a transmission unit which transmits the sound data and an analysis result by the analysis unit to a reproduction apparatus which reproduces sound data, wherein the sound data is reproduced by the reproduction apparatus to have a volume corrected in accordance with the analysis result, wherein the volume characteristic value represents a volume average value of the sound data, wherein the sound data is reproduced by the reproduction apparatus to have an amplified volume in a case where the volume average value of the sound data is lower than a reference average value determined on the basis of a distribution of the volume average value of the plurality of pieces of sound data, wherein the sound data is reproduced by the reproduction apparatus to have an attenuated volume in a case where the volume average value of the sound data is higher than the reference average value, and wherein the storage unit, the acquisition unit, the analysis unit, and the transmission unit are each implemented via at least one processor.

9. A reproduction system comprising:
a provision apparatus including a storage unit which stores sound data and a volume characteristic value of each of a plurality of pieces of sound data, an acquisition unit which acquires the sound data and the volume characteristic value of each of the plurality of pieces of sound data, an analysis unit which analyzes the sound data and analyzes a distribution of the volume characteristic values of the plurality of pieces of sound data, and a transmission unit which transmits an analysis result by the analysis unit; and a reproduction apparatus including a reception unit which receives the sound data and the analysis result from the provision apparatus, a reproduction unit which reproduces the sound data, and a volume correction unit which corrects a volume of the sound data reproduced by the reproduction unit on the basis of the analysis result, wherein the volume correction unit corrects the volume of the sound data in accordance with the analysis result, wherein the volume characteristic value represents a volume average value of the sound data, wherein the volume correction unit corrects the volume of the sound data reproduced by the reproduction apparatus to have an amplified volume in a case where the volume average value of the sound data is lower than a reference average value determined on the basis of a distribution of the volume average value of the plurality of pieces of sound data, wherein the volume correction unit corrects the volume of the sound data reproduced by the reproduction apparatus to have an attenuated volume in a case where the volume average value of the sound data is higher than the reference average value, and wherein the storage unit, the acquisition unit, the analysis unit, the transmission unit, the reception unit, the reproduction unit, and the volume correction unit are each implemented via at least one processor.

* * * * *